(12) United States Patent
Shintate et al.

(10) Patent No.: US 7,723,243 B2
(45) Date of Patent: May 25, 2010

(54) MULTI-LAYERED STRUCTURE FORMING METHOD, METHOD OF MANUFACTURING WIRING SUBSTRATE, AND METHOD OF MANUFACTURING ELECTRONIC APPARATUS

(75) Inventors: Tsuyoshi Shintate, Matsuyama-machi (JP); Toshiaki Mikoshiba, Suwa (JP); Kenji Wada, Fujimi-machi (JP); Kazuaki Sakurada, Suwa (JP); Jun Yamada, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 590 days.

(21) Appl. No.: 11/707,022

(22) Filed: Feb. 16, 2007

(65) Prior Publication Data

US 2007/0141828 A1 Jun. 21, 2007

Related U.S. Application Data

(62) Division of application No. 11/201,100, filed on Aug. 11, 2005, now Pat. No. 7,250,377.

(30) Foreign Application Priority Data

| Aug. 20, 2004 | (JP) | 2004-240939 |
| Sep. 27, 2004 | (JP) | 2004-278994 |
| Jun. 23, 2005 | (JP) | 2005-182752 |

(51) Int. Cl.
*H01L 21/31* (2006.01)
(52) U.S. Cl. ............... 438/778; 438/795; 257/E21.333
(58) Field of Classification Search ............... 438/778, 438/781, 795, 798; 257/921, E21.333
See application file for complete search history.

(56) References Cited

U.S. PATENT DOCUMENTS

2003/0213614 A1  11/2003  Furusawa et al.

FOREIGN PATENT DOCUMENTS

| JP | A 04-053297 |   | 2/1992 |
| JP | 06260763 A | * | 9/1994 |
| JP | A 06-260763 |   | 9/1994 |
| JP | A 2004-006578 |   | 1/2004 |
| JP | A 2004-165310 |   | 6/2004 |

\* cited by examiner

*Primary Examiner*—Quoc D Hoang
(74) *Attorney, Agent, or Firm*—Oliff & Berridge, PLC

(57) ABSTRACT

There is provided a multi-layered structure forming method comprising: (A) forming a first insulating material layer containing a first photo-curing material on a substrate; (B) semi-hardening the first insulating material layer by radiating light having a first wavelength to the first insulating material layer; (C) forming a conductive material layer on the semi-hardened first insulating material layer by ejecting droplets of a conductive material to the semi-hardened first insulating material layer from a nozzle of a liquid droplet ejecting apparatus; (D) forming a second insulating material layer containing a second photo-curing material so as to cover the semi-hardened first insulating material layer and the conductive material layer; and (E) forming a first insulating layer, a conductive layer positioned on the first insulating material, and a second insulating layer covering the first insulating layer and the conductive layer by simultaneously heating the first insulating material layer, the conductive material layer, and the second insulating material layer.

4 Claims, 13 Drawing Sheets

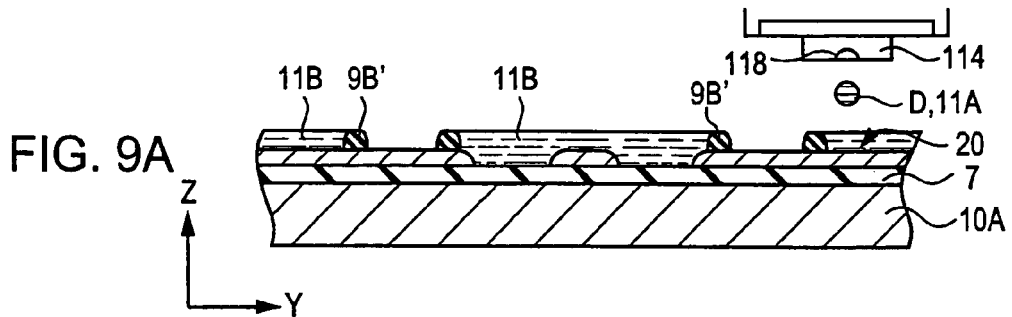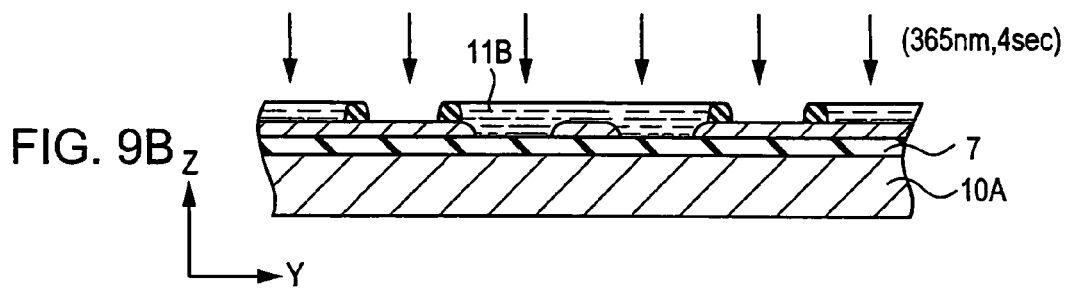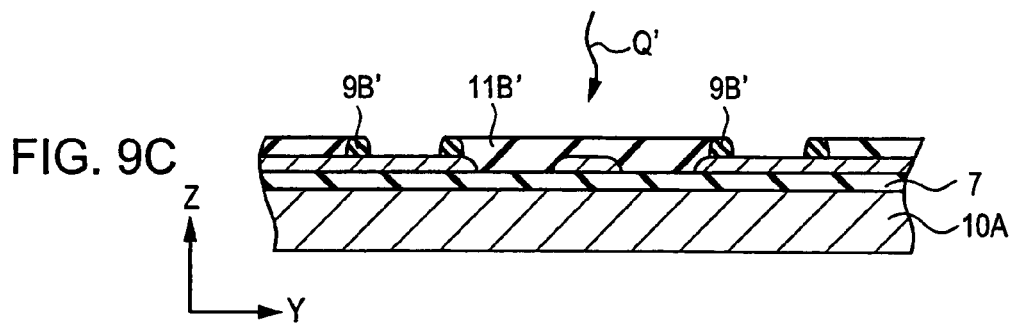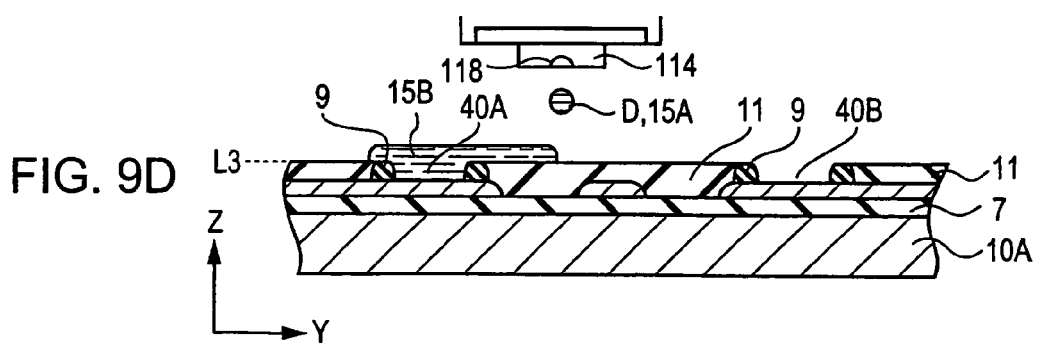

MULTI-LAYERED STRUCTURE FORMING METHOD, METHOD OF MANUFACTURING WIRING SUBSTRATE, AND METHOD OF MANUFACTURING ELECTRONIC APPARATUS

This is a Division of application Ser. No. 11/201,100 filed Aug. 11, 2005, which claims priority to Japanese Patent Applications No. 2004-240939, filed Aug. 20, 2004, No. 2004-278994, filed Sep. 27, 2004 and No. 2005-182752, filed Jun. 23, 2005. The disclosure of the prior application is hereby incorporated by reference herein in its entirety.

BACKGROUND OF THE INVENTION

1. Technical Field

The present invention relates to a multi-layered structure forming method using a liquid droplet ejecting apparatus and more particularly to a multi-layered structure forming method suitable for manufacturing a wiring substrate and an electronic apparatus.

2. Related Art

A method of manufacturing a wiring substrate or a circuit board by use of an additive process with a printing method has attracted attention. This is because cost for the additive process is lower than that for a method of manufacturing a wiring substrate or a circuit board by repeating a thin film coating process and a photolithography process.

A technique of forming a conductive pattern by use of an inkjet method is known as one technique used for the additive process (for example, see Japanese Unexamined Patent Application Publication No. 2004-6578).

Japanese Unexamined Patent Application Publication No. 2004-6578 is an example of the related art.

However, when a plurality of resin layers are stacked using an inkjet method, stress may remain in the interface between a base layer and a layer covering the base layer. As a result, when external impact or heat is applied, cracks may be generated in the interface.

When an insulating layer having a via hole is provided using an inkjet method, a first insulating pattern triming the via hole and a second insulating pattern surrounding the first insulating pattern are often formed individually. Specifically, the first insulating pattern is formed to trim the shape of the via hole and then the second insulating pattern is formed to surround the first insulating pattern. This is because the outline of the via hole is clearer and the insulating layer can be formed widely. However, in such a method, stress may remain in the interface between the insulating patterns individually formed, due to the hardening contraction at the time of hardening the insulating patterns. As a result, when external impact or heat is applied, cracks may be generated in the interface.

SUMMARY

An advantage of the invention is that it provides a multi-layered structure having structural stability by using an inkjet method.

According to an aspect of the invention, there is provided a multi-layered structure forming method comprising: (A) forming a first insulating material layer containing a first photo-curing material on a substrate; (B) semi-hardening the first insulating material layer by radiating light having a first wavelength to the first insulating material layer; (C) forming a conductive material layer on the semi-hardened first insulating material layer by ejecting droplets of a conductive material to the semi-hardened first insulating material layer from a nozzle of a liquid droplet ejecting apparatus; (D) forming a second insulating material layer containing a second photo-curing material so as to cover the semi-hardened first insulating material layer and the conductive material layer; and (E) forming a first insulating layer, a conductive layer positioned on the first insulating material, and a second insulating layer covering the first insulating layer and the conductive layer by simultaneously heating the first insulating material layer, the conductive material layer, and the second insulating material layer.

According to the construction described above, the first insulating material layer and the second insulating material layer are simultaneously heated. As a result, since the first insulating material layer and the second insulating material layer are simultaneously hardened, stress does not remain between the resultant first and second insulating layers.

The multi-layered structure forming method may further comprise (F) semi-hardening the second insulating material layer by radiating light having a second wavelength to the second insulating material layer, between the (D) and (E).

One advantage obtained from the above-mentioned construction is that the shape of the second insulating material layer is hardly deformed even when it is much time to initiate the thermal-hardening of the second insulating material layer. Since the photo-curing material in the second insulating material layer is polymerized by means of irradiation of light, the fluidity of the second insulating material layer can be decreased.

The invention can be embodied in various forms. For example, the invention can be embodied as a method of manufacturing a wiring substrate or a method of manufacturing an electronic apparatus.

According to another aspect of the invention, there is provided a multi-layered structure forming method comprising: (A) forming a first insulating material layer containing a first photo-curing material on a substrate; (B) semi-hardening the first insulating material layer by radiating light having a first wavelength to the first insulating material layer; (C) forming a second insulating material layer containing a second photo-curing material so as to cover the semi-hardened first insulating material layer; and (D) forming a first insulating layer and a second insulating layer covering the first insulating layer by simultaneously heating the first insulating material layer and the second insulating material layer.

According to the construction described above, the first insulating material layer and the second insulating material layer are simultaneously heated. As a result, since the first insulating material layer and the second insulating material layer are simultaneously hardened, stress does not remain between the resultant first and second insulating layers.

According to another aspect of the invention, there is provided a multi-layered structure forming method using a liquid droplet ejecting apparatus, the method comprising: (A) forming a first insulating material pattern triming a via hole on a wire pattern by ejecting droplets of a first insulating material containing a first photo-curing material; (B) semi-hardening the first insulating material pattern by radiating light having a first wavelength to the first insulating material pattern; (C) forming a second insulating material pattern coming in contact with the semi-hardened first insulating material pattern by ejecting droplets of a second insulating material containing a second photo-curing material; and (D) simultaneously heating and hardening the semi-hardened first insulating material pattern and the second insulating material.

One advantage obtained from the above-mentioned construction is that stress does not remain in the interface between the patterns after the first insulating material pattern and the second insulating material pattern are heated and hardened.

The multi-layered structure forming method may further comprise (E) semi-hardening the second insulating material pattern by radiating light having a second wavelength to the second insulating material pattern, between the (C) and (D).

One advantage obtained from the above-mentioned construction is that the shape of the second insulating material pattern is hardly deformed even when it is much time to initiate the thermal-hardening of the second insulating material pattern. Since the photo-curing material in the second insulating material pattern is polymerized by means of irradiation of light, the fluidity of the second insulating material layer can be decreased.

The wire pattern may be a gold (Au) wire pattern formed on the substrate.

One advantage obtained from the above-mentioned construction is that the via hole can be formed in the gold (Au) wire pattern by using the liquid droplet ejecting apparatus.

The multi-layered structure forming method may further comprise: (F) forming a conductive material pattern on the surface of an object by ejecting droplets of the conductive material; and (G) forming the wire pattern by activating the conductive material pattern.

One advantage obtained from the above-mentioned construction is that the wire pattern can be formed by using the liquid droplet ejecting apparatus.

In the (F), droplets containing silver (Ag) may be ejected. The wire pattern may be a silver wire pattern.

One advantage of the above-mentioned construction is that the wire pattern can be easily formed by using the liquid droplet ejecting apparatus.

The invention can be embodied in various forms. Specifically, the invention can be embodied as a method of manufacturing a wiring substrate and a method of manufacturing an electronic apparatus.

BRIEF DESCRIPTION OF THE DRAWING

The invention will be described with reference to the accompanying drawings, wherein like numbers reference like elements and wherein:

FIGS. 9A to 9D are cross-sectional views illustrating the method of manufacturing the wiring substrate according to the second embodiment;

DESCRIPTION OF THE EMBODIMENTS

First Embodiment

A. Entire Structure of Liquid Droplet Ejecting Apparatus

Figure 1:
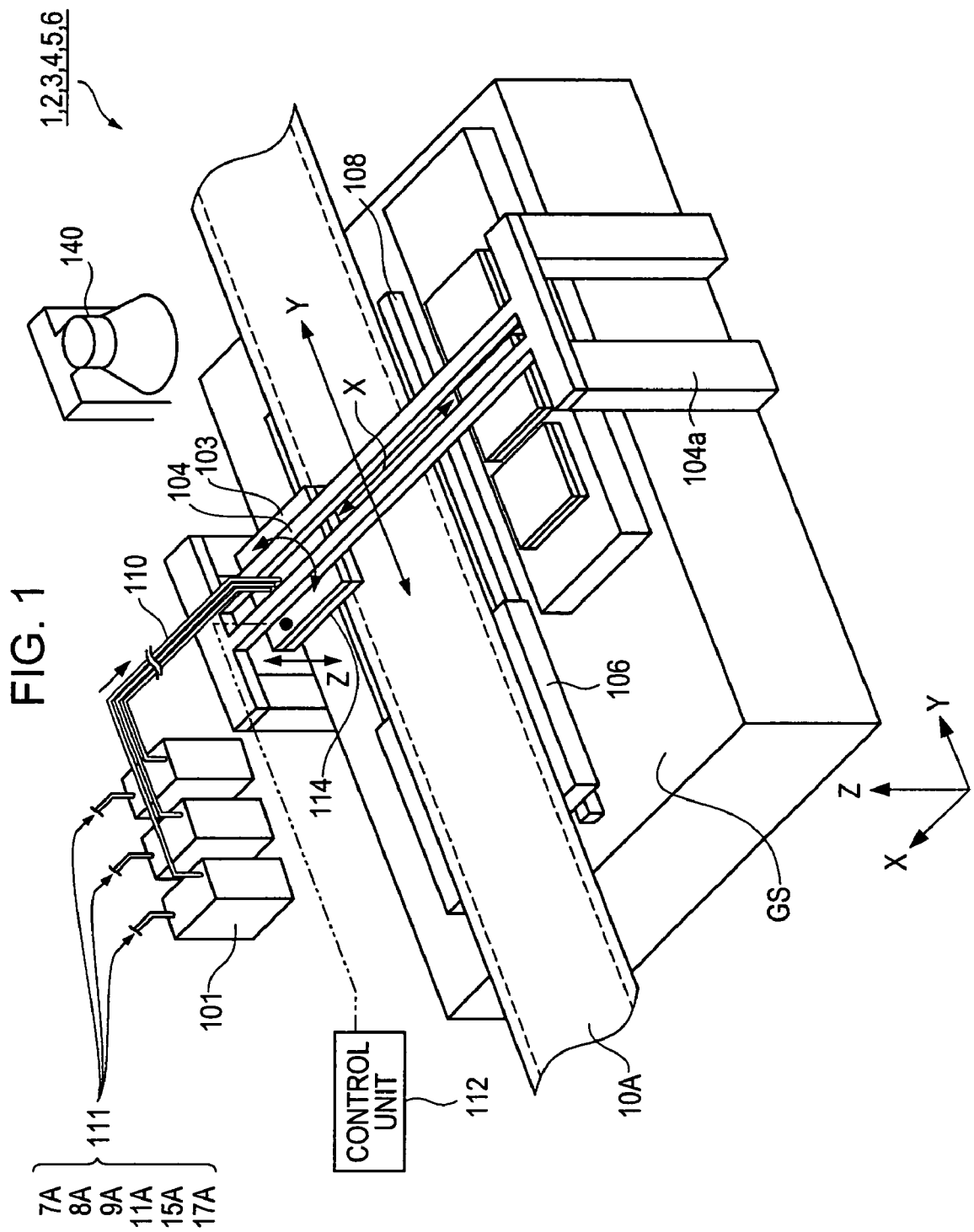
FIG. 1 is a schematic view illustrating a liquid droplet ejecting apparatus according to first, second, and third embodiments of the present invention.

A liquid droplet ejecting apparatus 1 shown in FIG. 1 is an apparatus used in a multi-layered structure forming method according to a first embodiment of the present invention. However, in the multi-layered structure forming method according to the first embodiment, liquid droplet ejecting apparatuses 2 and 3 are used in addition to the liquid droplet ejecting apparatus 1. In multi-layered structure forming methods according to second and third embodiments of the invention to be described later, liquid droplet ejecting apparatuses 2, 3, 4, 5, and 6 are also used in addition to the liquid droplet ejecting apparatus 1.

In the first to third embodiments, the six liquid droplet ejecting apparatuses 1 to 6 are used for ejecting an insulating material 7A (FIG. 1), a conductive material 8A, an insulating material 9A, an insulating material 11A, a conductive material 15A, and an insulating material 17A, respectively. As described later, the insulating material 7A (FIG. 1), the conductive material 8A, the insulating material 9A, the insulating material 11A, the conductive material 15A, and the insulating material 17A are all one of "liquid materials".

Structures and functions of liquid droplet ejecting apparatuses 2 to 6 are basically the same as the structure and function of the liquid droplet ejecting apparatus 1. Therefore, the following description on the structure and function of the liquid droplet ejecting apparatus 1 is applied to those of the liquid droplet ejecting apparatuses 2 to 6.

Referring to FIG. 1, the liquid droplet ejecting apparatus 1 is basically an inkjet apparatus. More specifically, the liquid droplet ejecting apparatus 1 includes tanks 101 containing liquid materials 111, tubes 110, a grand stage GS, an ejecting head unit 103, a stage 106, a first position controller 104, a second position controller 108, a control unit 112, a light irradiating device 140, and a supporting unit 104a.

The ejecting head unit 103 has a head 114 (FIG. 2). The head 114 ejects the liquid droplets of the liquid materials 111 according to a signal from the control unit 112. In addition, the head 114 in the ejecting head unit 103 is connected to the tanks 101 through the tubes, so that the liquid materials 111 can be supplied from the tanks 101 to the head 114.

The stage 106 provides a plane for fixing a substrate 10A. In addition, the stage 106 has an additional function of fixing a position of the substrate 10A by using an absorbing force. Here, substrate 10A is a flexible substrate made of polyimide, and the shape thereof is a tape shape. In addition, both ends of the substrate 10A are fixed to a pair of reels.

The first position controller 104 is fixed to a predetermined height from the grand stage GS by the supporting unit 104a. The first position controller 104 has a function of moving the ejecting head unit 103 in an X-axis direction and a Z-axis direction perpendicular to the X-axis direction according to the signal from control unit 112. In addition, the first position controller 104 has a function of rotating the ejecting head unit 103 about a shaft parallel to the Z axis. Here, in the embodiment, the Z-axis direction is a direction parallel to the vertical direction (that is, the direction of gravitational acceleration).

The second position controller 108 move the stage 106 in a Y-axis direction on the grand stage GS according to a signal from the control unit 112. Here, the Y-axis direction is a direction perpendicular to both of the X-axis direction and the Z-axis direction.

The construction of the first position controller 104 and the construction of the second position controller 108 having the above-mentioned functions can be implemented by using a well-known XY robot with linear motors or servo motors. Therefore, description on the detailed construction thereof is omitted. In addition, in the specification, the first and second position controllers 104 and 108 may be referred to as a "robot" or "scanning unit".

As described above, the ejecting head unit 103 is moved in the X-axis direction by the first position controller 104. In addition, the substrate 10A is moved together with the stage 106 in the Y-axis direction by the second position controller 108. As a result, a relative position of the head 114 to the substrate 10A changes. More specifically, by the operations thereof, the ejecting head unit 103, the head 114, the nozzles 118 (FIG. 2) relatively moves, that is, relatively scan, while maintaining predetermined distances from "the substrate 10A in the Z-axis direction. The "relative movement" or "relative scanning" means relatively moving at least one of a part which ejects the liquid materials 111 and a part on which the ejected materials reaches.

The control unit 112 is constructed to receive from an external information processing unit ejection data representing the relative positions to which the liquid droplets of the liquid materials 111 are to be ejected. The control unit 112 stores the received ejection data in an internal storage device and controls the first position controller 104, the second position controller 108, and the head 114 according to the stored ejection data. In addition, the ejection data means data for applying the liquid materials 111 in a predetermined pattern on the substrate 10A. In the embodiment, the ejection data has a bitmap data format.

The liquid droplet ejecting apparatus 1 having the above construction relatively moves the nozzles 118 (FIG. 2) of the head 114 with respect to the substrate 10A and ejects the liquid materials 111 form the nozzle 118 to the ejecting target portion according to the ejection data. In addition, in some cases, the relative movement of the head 114 and the ejection of the liquid material 11 from the head 114 by the liquid droplet ejecting apparatus 1 may be collectively referred to as a "coating scan" or an "ejecting scan".

In the specification, a portion which the liquid droplets of the liquid materials 111 reach is also referred to as an "ejecting target portion".

In addition, a portion to which the reached liquid droplets are wet-diffused is also referred to as a "coating portion". Any one of the ejecting target portion and the coating portion is a portion formed by performing a surface reforming process on an underlying object, so that the liquid materials shows desired contact angles. However, in a case where the surface of the underlying object shows a desired lyophobic or lyophilic property without the surface reforming process performed (that is, a case where the reached liquid materials show desired contact angles on the surface of the underlying object), the surface of the underlying object may be referred as the "ejecting target portion" to "coating portion". In addition, in the specification, "ejecting target portion" may also be referred as a "target" or "receiving portion".

Returning to FIG. 1, the light irradiating device 140 is an apparatus for irradiating UV light on the liquid materials 111 applied to the substrate 10A. The on and off operations of UV light irradiation of the light irradiating device 140 are controlled by the control unit 112.

In addition, forming layers, films, or patterns by using the inkjet method is forming the layers, films, or patterns on a predetermined object by using the liquid droplet ejecting apparatus 1 or the like.

B. Head

Figure 2A:
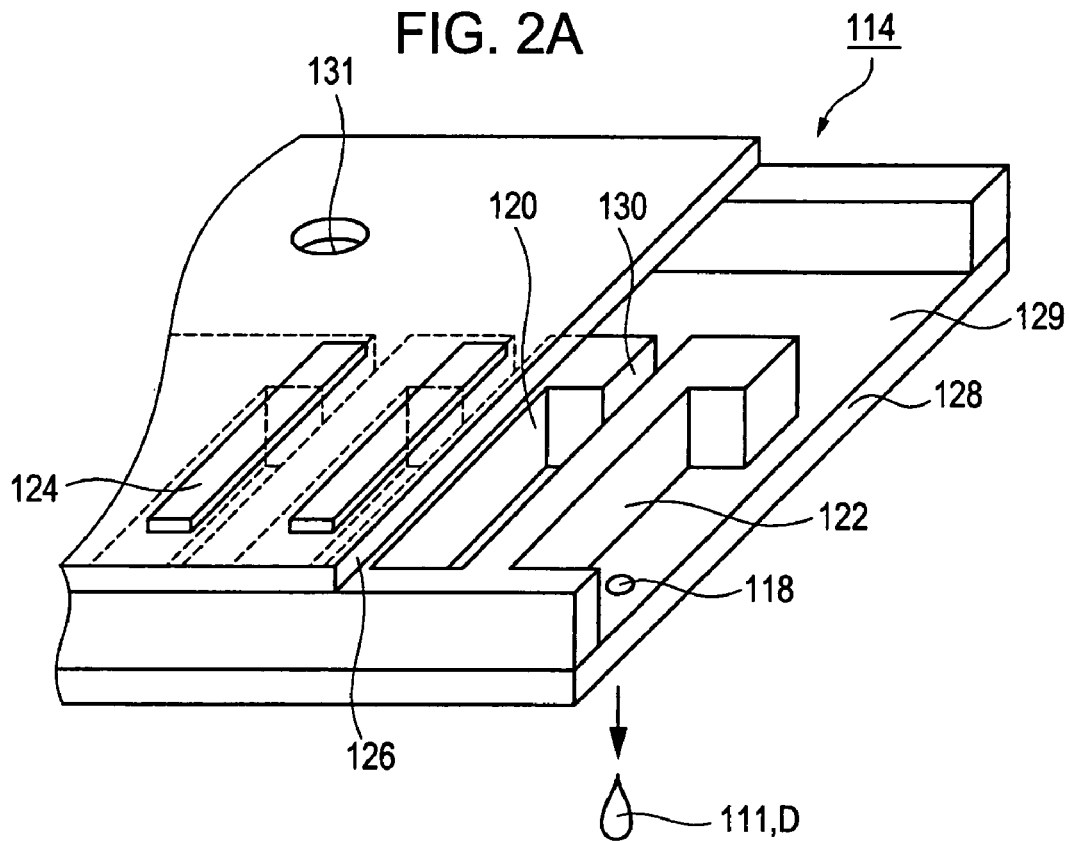
FIGS. 2A and 2B are schematic views illustrating a head of the liquid droplet ejecting apparatus.
Figure 2B:
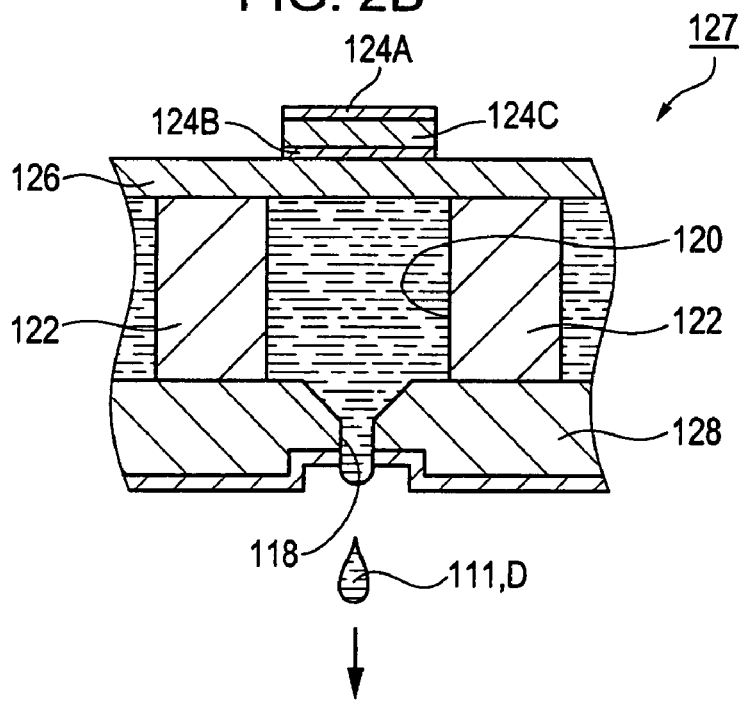

As shown in FIGS. 2A and 2B, the head 114 in the liquid droplet ejecting apparatus 1 is an inkjet head having a plurality of nozzles 118. More specifically, the head 114 includes a vibration plate 126, a liquid storing portion 129, a plurality of partitions 122, a plurality of vibrators 124, a nozzle plate 128 for defining holes of a plurality of the nozzles 118, supplying ports 130 and an opening 131. The liquid storing portion 129 is interposed between the vibration plate 126 and nozzle plate 128. The liquid storing portion 129 is always filled with the liquid materials 111 supplied through the opening 131 form an external tank (not shown).

In addition, a plurality of the partitions 122 are disposed between the vibration plate 126 and the nozzle plate 128. In addition, a portion surrounded by the vibration plate 126, the nozzle plate 128, and a pair of the partitions 122 is one of cavities 120. Since the cavities 120 are disposed corresponding to the nozzles 118, the number of cavities 120 is equal to the number of nozzles 118. To the cavities 120, the liquid materials 111 are supplied through the supplying ports interposed between pairs of the partitions 122 from liquid storing portion 129. In addition, in the embodiment, diameters of the nozzles 118 are about 27 µm.

On the vibration plate 126, the vibrators 124 are disposed corresponding to the cavities 120. Each of the vibrators 124 includes a piezoelectric element 124C and a pair of electrodes 124A and 124B which the piezoelectric element 124C is interposed between. When the control unit 112 applies a driving voltage across the pair of electrodes 124A and 124B, the liquid droplets of liquid materials 111D are ejected from the corresponding nozzle 118. Here, the volume of the material ejected from the nozzles 118 is in a variable range of from 0 to 42 pl (pico-liter). In addition, the shape of the nozzle 118 is adjusted, so that the liquid droplets of the liquid materials 111D can be ejected in the Z-axis direction from the nozzles 118.

In the specification, in some cases, a unit including a single nozzle 118, a cavity 120 corresponding to the nozzle 118, and a vibrator 124 corresponding to the cavity 120 may be referred to as an "ejecting unit". According to this notation, a single head 114 has the same number of ejecting units as the number of nozzles 118. The ejecting unit may have an electric thermal conversion element instead of the piezoelectric element. Namely, the ejecting unit may have a structure for ejecting the material by using the thermal expansion of the material due to the electric thermal conversion element.

C. Control Unit

Figure 3:
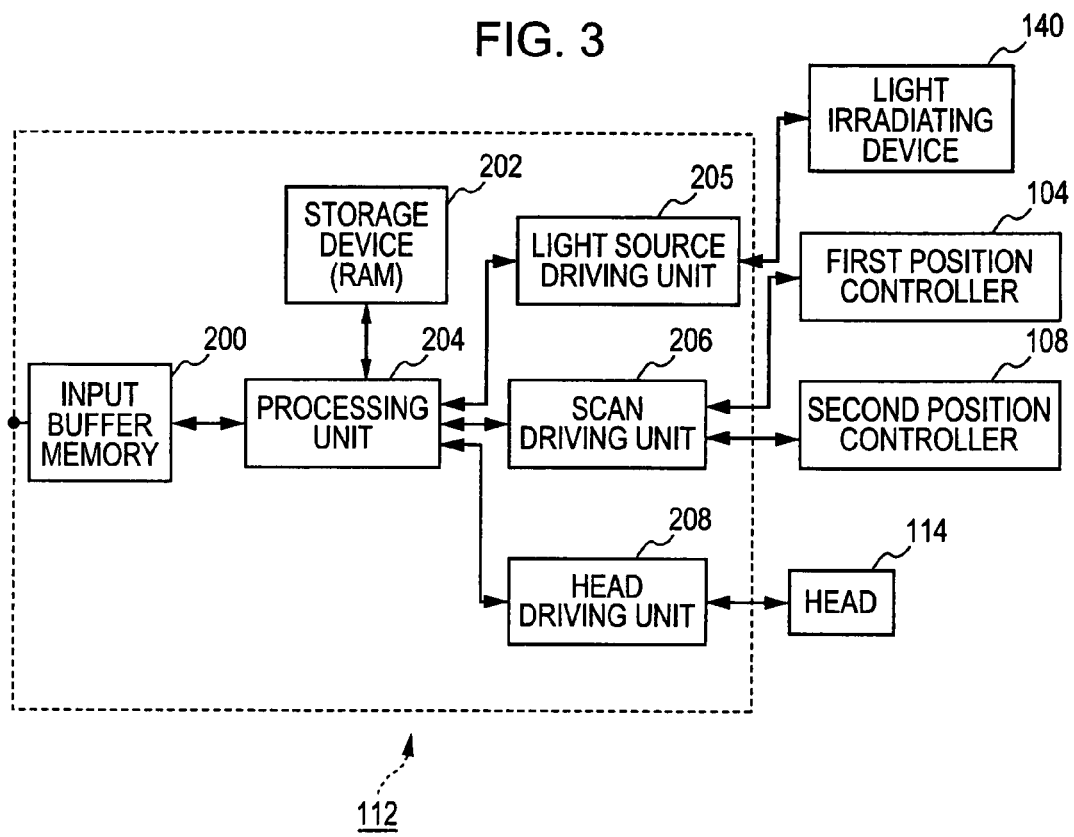
FIG. 3 is a functional block diagram of a control unit of the liquid droplet ejecting apparatus.

Now, a construction of the control unit 112 will be described. As shown in FIG. 3, the control unit 112 includes an input buffer memory 200, a storage device 202, a processing unit 204, a light source driving unit 205, a scan driving unit 206, and a head driving unit 208. The input buffer memory 200 and the processing unit 204 are connected to each other in a communication-able manner. The processing unit 204, the storage device 202, the light source driving unit 205, the scan driving unit 206, and the head driving unit 208 are connected to each other via buses (not shown) in a communicationable manner.

The light source driving unit 205 is connected to the light irradiating device 140 in a communication-able manner. In addition, the scan driving unit 206 is connected to the first position controller 104 and the second position controller 108 in a communication-able manner. Similarly, the head driving unit 208 is connected to the head 114 in a communication-able manner.

The input buffer memory 200 receives from an external information processing unit (not shown) disposed outside the liquid droplet ejecting apparatus 1 the ejection data for ejecting the liquid droplets of liquid materials 111. The input buffer memory 200 transmits the ejection data to the processing unit 204, and the processing unit 204 stores the ejection data in a storage device 202. In FIG. 3, the storage device 202 is a RAM.

The processing unit 204 applies the data indicating a relative position of the nozzle 118 with respect to the ejecting target portion to a scan driving unit 206 according to the ejection data in the storage device 202. The scan driving unit 206 applies the data and the stage driving signal according to an ejection period to the first position controller 104 and second position controller 108. As a result, the relative position of the ejecting head unit 103 with respect to the ejecting target portion changes. On the other hand, the processing unit 204 applies to the head 114 the ejection signal needed to eject the liquid materials 111 based on the ejection data stored in the storage device 202. As a result, the liquid droplets of the liquid materials 111D are ejected from the nozzles 118 corresponding to the head 114.

In addition, the processing unit 204 allows the light irradiating device 140 to be in one of ON and OFF states based on the ejection data in the storage device 202. More specifically, the processing unit 204 applies signals indicating the ON and OFF states to the light source driving unit 205, so that the light source driving unit 205 can set the state of the light irradiating device 140.

The control unit 112 is a computer including CPU, ROM, RAM, and buses. Therefore, the functions of the control unit 112 are implemented by software programs executed by the computer. Alternatively, the control unit 112 may be implemented with dedicated circuits (hardware).

D. Liquid Material

The "liquid material 111" means a material having a viscosity with which the material can be ejected in droplets D from the nozzles 118 of the head 114. Here, it is not important whether the liquid material 111 is aqueous or oily. It is enough if only the liquid material has a fluidity (viscosity) with which the liquid material can be ejected from the nozzles 118. Even if solid substances are mixed thereto, it is enough if only it is a fluid as a whole. Here, it is preferable that the viscosity of the liquid material 111 ranges 1 m·Pa·s to 50 m·Pa·s. In ejecting the liquid droplets D of the liquid material 111, when the viscosity is greater than or equal to 1 m·Pa·s, the surroundings of the nozzles 118 can be hardly contaminated by the liquid material 111. On the other hand, when the viscosity is smaller than or equal to 50 m·Pa·s, the frequency of clogging of the nozzles 118 is small, thereby realizing the smooth ejection of the liquid droplets D.

The conductive materials 8A and 15A (see FIGS. 4D and 9D) to be described later is a kind of the liquid material 111. The conductive materials 8A and 15A according to the first embodiment include silver particles with a particle diameter of about 10 nm and a dispersion medium. In the conductive materials 8A and 15A, the silver particles are stably dispersed in the dispersion medium. The silver particles may be coated with a coating agent. Here, the coating agent is a compound which can be coordinate-coupled to a silver atom.

The dispersion medium (or solvent) is not particularly limited if only it can disperse the conductive particles such as silver particles and does not cause cohesion. Examples of the dispersion medium may include water; alcohols such as methanol, ethanol, propanol, butanol, etc.; hydrocarbon compounds such as n-heptane, n-octane, decane, dodecane, tetradecane, toluene, xylene, cymene, durene, indene, dipentene, tetrahydro naphthalene, decahydro naphthalene, cyclohexyl benzene, etc.; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc.; polar compounds such as propylene carbonate, γ-butyrolactone, N-methyl-2-pyrrolidone, dimethyl formamide, dimethyl sulfoxide, cyclohexanone, etc.; and so on. Among the above-mentioned compounds, from the view point of a dispersion property of conductive particles, stability of a dispersion liquid, and easy application to the liquid droplet ejecting method (inkjet method), water, alcohols, hydrocarbon compounds, and ether compounds are preferable as the dispersion medium, and water and hydrocarbon compounds are more preferable as the dispersion medium.

The particles having an average diameter of 1 nm to several hundreds nm are also expressed as "nano particles." Referring to this expression, the conductive materials 8A and 15A include nano particles of silver.

The insulating materials 7A, 9A, 11A, and 17A (see FIGS. 1, 4A, 5A, and 9A) to be described later are the liquid material 111. The insulating materials 7A, 9A, 11A, and 17A all include acryl photosensitive resin. In the embodiment, the acryl photosensitive resin corresponds to the "first photo-curing material" and the "second photo-curing material" according to the invention. In the first embodiment, the "first photo-curing material" and the "second photo-curing material" are equal to each other.

Generally, the "photo-curing material" in the invention may contain a solvent and a resin dissolved in the solvent. Here, the "photo-curing material" may contain a resin that is sensitive to light to enhance the degree of polymerization, or a resin and a photo-polymerization initiator that initiates the hardening of the resin.

Of course, in addition to such a type, the "photo-curing material in the invention may contain a monomer that is photo-polymerized to generate an insulating resin and a photo-polymerization initiator that initiates the photo-polymerization of the monomer. However, the "photo-curing material" may not contain the photopolymerization initiator if only the monomer has a photo-functional group.

Now, a method of manufacturing a wiring substrate using the multi-layered structure forming method according to the first embodiment will be described.

E. Manufacturing Method

First, a surface S of a substrate 10A is cleaned with UV. By means of the UV cleaning, the surface S is cleaned not only but also the surface S exhibits the lyophilic property to the liquid insulating material 7A to be described later. As a result, in the embodiment, the surface S having been subjected to the UV cleaning becomes the ejecting target portion and the coating portion.

Figure 4A:
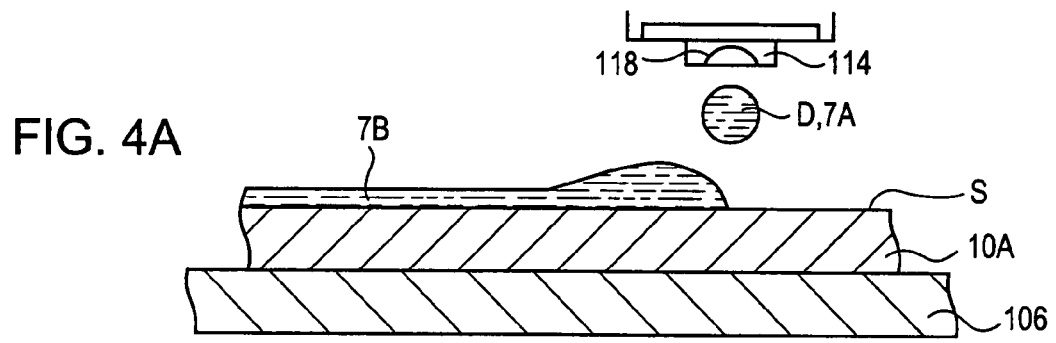
FIGS. 4A to 4D are cross-sectional views illustrating a method of manufacturing a wiring substrate according to the first embodiment.

Next, as shown in FIG. 4A, an insulating material layer 7B is formed on the whole surface S by the liquid droplet ejecting apparatus 1. Specifically, first, the substrate 10A is positioned on the stage 106 of the liquid droplet ejecting apparatus 1. Then, the liquid droplet ejecting apparatus 1 varies the relative position of the nozzles 118 to the surface S two-dimensionally (in the X axis direction and the Y axis direction). The liquid droplet ejecting apparatus 1 ejects the droplets D of the liquid insulating material 7A to the surface S from the nozzles 118 with a predetermined cycle. Then, a plurality of droplets D reaches the whole surface S with a predetermined pitch and is wet-diffused thereon. When the reached droplets D are wet-diffused, the insulating material layer 7B covering the surface S is obtained. The volume and number of droplets D of the ejected insulating material 7A are set such that the thickness of the insulating layer 7 obtained after the heating process to be described is about 10 μm.

The insulating material layer 7B does not necessarily cover the whole surface of the substrate 10A having a tape shape but may cover a range enough to serve as a base of the pattern (FIG. 5D) of the conductive layer 8 to be described.

Here, the nozzles 118 in the head 114 of the liquid droplet ejecting apparatus 1 are denoted by "first nozzles."

In the first embodiment, the substrate 10A and one or more layers provided on the substrate 10A are comprehensively denoted by a "base body 10B."

Figure 4B:
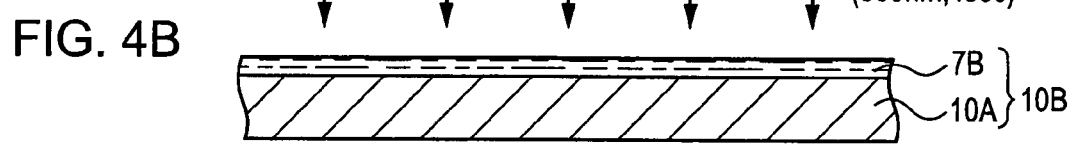
Figure 4C:

After forming the insulating material layer 7B, as shown in FIGS. 4B and 4C, the resultant-insulating material layer 7B is semi-hardened to form an insulating material layer 7B'. Specifically, by irradiating the light having a UV wavelength to the insulating material layer 7B from the light irradiating device 140 for about 4 sec, the semi-hardened insulating material layer 7B' is obtained. In the first embodiment, the wavelength of the light irradiated to the insulating material layer 7B is 365 nm. The wavelength of the light irradiated to the insulating material layer 7B corresponds to a "first wavelength" of the invention.

Here, the semi-hardening the "insulating material layer" or the "insulating material" means that the photo-curing material contained in the "insulating material layer" or the "insulating material" lies in an intermediate state between the ejected state and the completely-hardened state. In the first embodiment, the intermediate state means the "semi-hardened state". The ejected state means a state that the photo-curing material has the viscosity to be ejected from the nozzles 118.

Figure 4D:
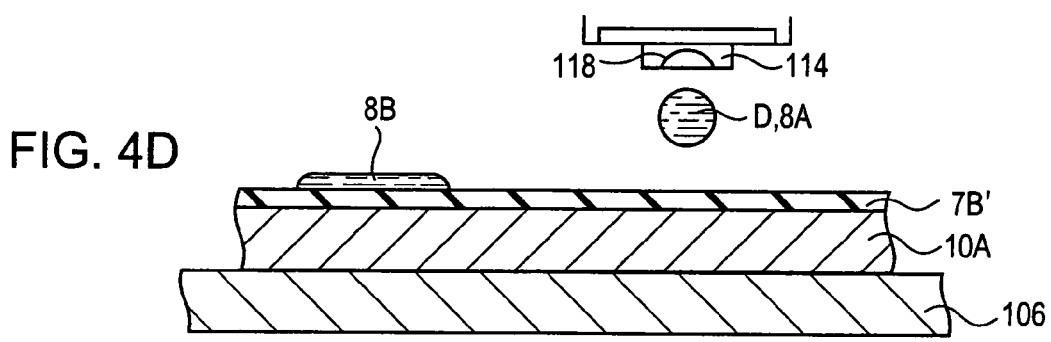

Next, as shown in FIG. 4D, a pattern of the conductive material layer 8B is formed on the semi-hardened insulating material layer 7B' by using the liquid droplet ejecting apparatus 2. Specifically, first, the substrate 10A is positioned on the stage 106 of the liquid droplet ejecting apparatus 2. Then, the liquid droplet ejecting apparatus 2 varies the relative position of the nozzles 118 to the surface of the insulating material layer 7B' two-dimensionally. Then, the liquid droplet ejecting apparatus 2 ejects the droplets D of the liquid conductive material 8A to the surface of the insulating material layer 7B' from the nozzles 118 every time the nozzles 118 reach the position corresponding to the pattern of the conductive material layer 8B. Accordingly, a plurality of droplets D reaches the position at which the pattern of the conductive layer 8 (FIG. 5D) should be formed and is wet-diffused. When the reached droplets D are wet-diffused, the pattern of the conductive material layer 8B is formed on the insulating material layer 7B'. The volume and number of the droplets D of the conductive material 8A to be ejected are set such that the thickness of the conductive layer 8 obtained after the heating process to be described is about 4 μm.

Here, the nozzles 118 in the head 114 of the liquid droplet ejecting apparatus 2 are denoted by "second nozzles."

Figure 5A:
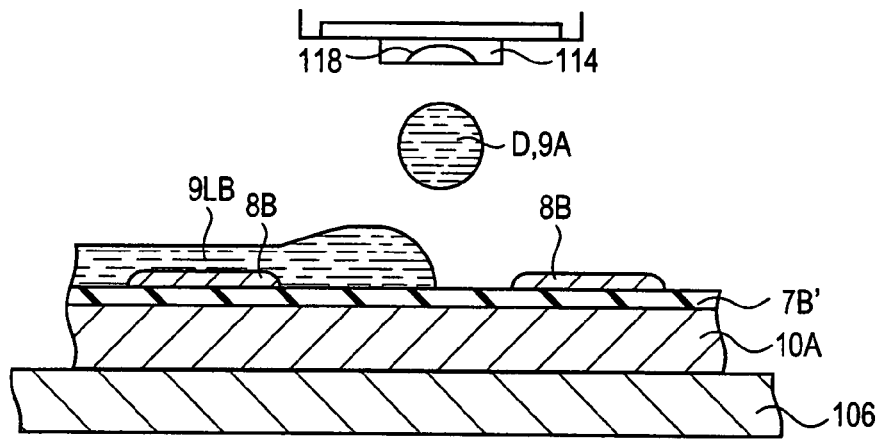
FIGS. 5A to 5D are cross-sectional views illustrating the method of manufacturing the wiring substrate according to the first embodiment.

In the first embodiment, as shown in FIG. 5A, the pattern of the conductive material layer 8B includes two stripe portions parallel to each other. Each stripe portion is positioned on a part of the insulating layer 7 (FIG. 5D). The width of each stripe portion is about 50 μm and the longitudinal direction is perpendicular to the paper plane of FIG. 5A.

Next, as shown in FIG. 5A, an insulating material layer 9LB covering the insulating material layer 7B' and the conductive material layer 8B is formed using the liquid droplet ejecting apparatus 3. Specifically, the substrate 10A is positioned on the stage 106 of the liquid droplet ejecting apparatus 3. Then, the liquid droplet ejecting apparatus 3 varies the relative position of the nozzles 118 to the insulating material layer 7B' and the conductive material layer 8B two-dimensionally. The liquid droplet ejecting apparatus 3 ejects the droplets D of the liquid insulating material 9A to the insulating material layer 7B' and the conductive material layer 8B with a predetermined cycle from the nozzles 118. Then, a plurality of droplets D reaches the whole surface of the insulating material layer 7B' and the conductive material layer 8B with a predetermined pitch and is wet-diffused. When the reached droplets D are wet-diffused, the insulating material layer 9LB covering the insulating material layer 7B' and the conductive material layer 8B is obtained. The volume and number of the droplets D of the insulating material 9A to be ejected is set such that the thickness of the insulating layer 9L obtained after the heating process to be described later is about 10 μm.

Here, the nozzles 118 in the head 114 of the liquid droplet ejecting apparatus 3 are denoted by "third nozzles."

Figure 5B:
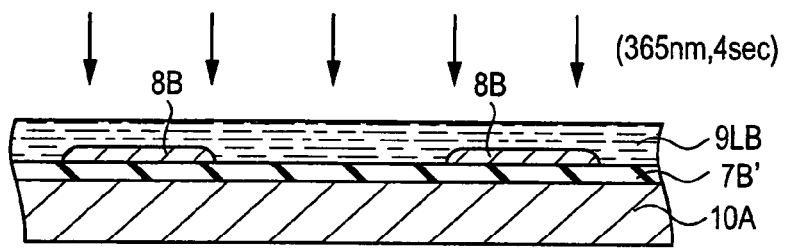

After forming the insulating material layer 9LB, as shown in FIG. 5B, the resultant insulating material layer 9LB is semi-hardened to form an insulating material layer 9LB'. Specifically, by irradiating the light having a UV wavelength to the insulating material layer 9LB from the light irradiating device 140 for about 4 sec, the semi-hardened insulating material layer 9LB' is obtained. In the first embodiment, the wavelength of the light irradiated to the insulating material layer 9LB is 365 nm. The wavelength of the light irradiated to the insulating material layer 9LB corresponds to a "second wavelength" of the invention. In the first embodiment, the "first wavelength" and the "second wavelength" are equal. However, when the photo-curing material contained in the insulating material layer 7B and the photo-curing material contained in the insulating material layer 9LB are different from each other, the "first wavelength" and the "second wavelength" may be different from each other.

Figure 5C:
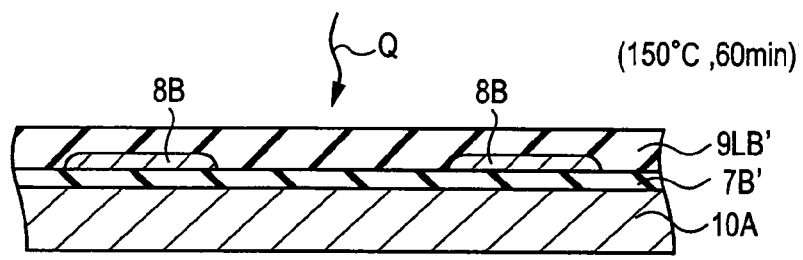
Figure 5D:
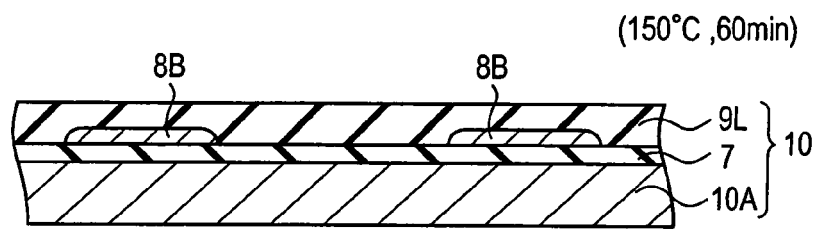

By heating the base body 10B after obtaining the semi-hardened insulating material layer 9LB', as shown in FIG. 5C, an amount of heat Q is given to the base body. In the first embodiment, the base body 10B is heated with a clean oven at a temperature of 150° C. for about 60 minutes. Since the polymerization of resin in the insulating material layer 7B' and the insulating material layer 9LB' is further advanced due to the heating, the resin in the respective layers is hardened. As a result, the insulating layer 7 and the insulating layer 9L are obtained from the insulating material layer 7B' and the insulating material layer 9LB'.

Since the silver particles in the conductive material layer 8B are sintered or fused at the same time as forming the insulating layer 7 and the insulating layer 9L, the conductive layer 8 is obtained from the conductive material layer 8B.

Through the processes described hitherto, as shown in FIG. 5D, the multi-layered structure including the insulating layer 7 covering the substrate 10A, the pattern of the conductive layer 8 positioned on the insulating layer 7, and the insulating layer 9L covering the pattern of the insulating layer 7 and the pattern of the conductive layer 8 is obtained. In the first embodiment, the insulating layer 7 and the insulating layer 9L are an acryl resin and the conductive layer 8 is a wire. The substrate 10A provided with the conductive layer 8 is denoted by a "wiring substrate 10."

According to the first embodiment, the insulating material layer 7B', the conductive material layer 8B, and the insulating material layer 9LB' are simultaneously heated. As a result, since the resin constituting the insulating material layer 7B' and the resin constituting the insulating material layer 9LB' are simultaneously contracted, no stress remains in the interface between the insulating layer 7 and the insulating layer 9L obtained finally. Accordingly, a multi-layered structure stable against external impact or heat is obtained on the substrate 10A.

Second Embodiment

Now, a method of manufacturing a wiring substrate using a multi-layered structure forming method according to a second embodiment will be described. Hereinafter, the same elements as those described in the first embodiment are denoted by the same reference numerals as the first embodiment.

F. Manufacturing Method

First, a surface S of a substrate 10A is cleaned with UV. By means of the UV cleaning, the surface S is cleaned not only but also the surface S exhibits the lyophilic property to the liquid insulating material 7A to be described later. As a result, in the embodiment, the surface S having been subjected to the UV cleaning becomes the ejecting target portion and the coating portion.

Figure 6A:
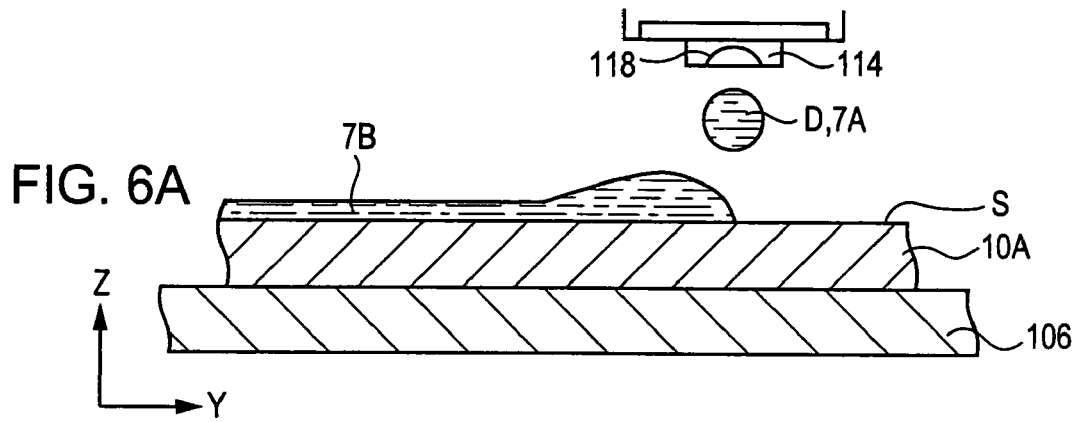
FIGS. 6A to 6D are cross-sectional views illustrating a method of manufacturing a wiring substrate according to the second embodiment.

Next, as shown in FIG. 6A, an insulating material layer 7B is formed on the whole surface S by the liquid droplet ejecting apparatus 1. Specifically, first, the substrate 10A is positioned on the stage 106 of the liquid droplet ejecting apparatus 1. Then, the liquid droplet ejecting apparatus 1 varies the relative position of the nozzles to the surface S two-dimensionally (in the X axis direction and the Y axis direction). The liquid droplet ejecting apparatus 1 ejects the droplets D of the liquid insulating material 7A to the surface S from the nozzles 118 with a predetermined cycle in accordance with first ejection data. Then, a plurality of droplets D reaches the whole surface S with a predetermined pitch and is wet-diffused thereon. When the reached droplets D are wet-diffused, the insulating material layer 7B covering the surface S is obtained. The volume and number of droplets D of the ejected insulating material 7A are set such that the thickness of the insulating layer 7 (FIG. 6C) obtained after the hardening process to be described is about 10 μm.

FIG. 6 shows the YZ section of the substrate 10A. The YZ section is a plane parallel to both of the Y axis direction and the Z axis direction. In the second embodiment, the substrate 10A and one or more layers provided on the substrate 10A are comprehensively denoted by a "base body 10B."

Figure 6B:
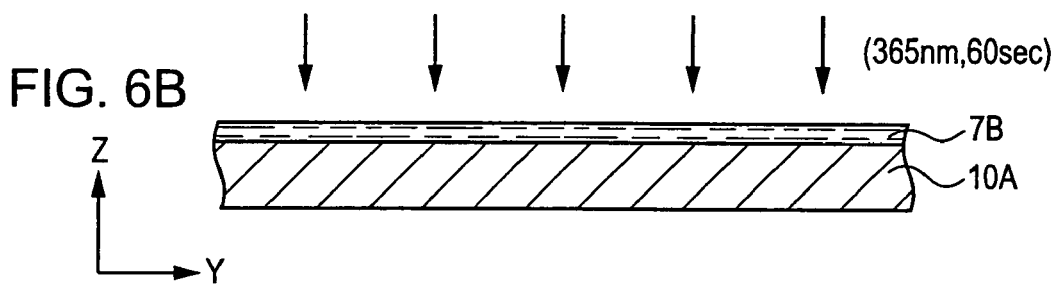
Figure 6C:
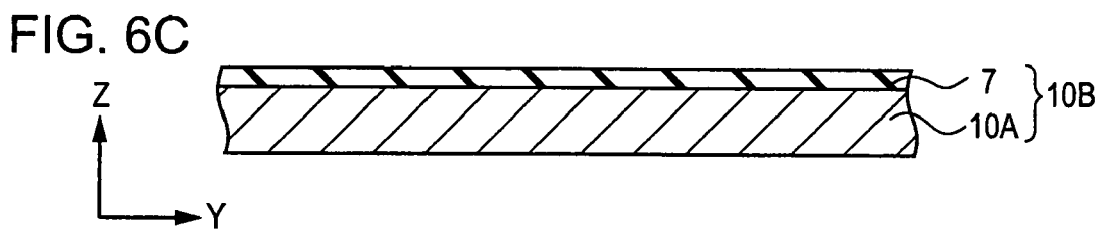

As shown in FIGS. 6B and 6C, the resultant insulating material layer 7B is hardened to form the insulating layer. Specifically, by irradiating the light having a first wavelength to the insulating material layer 7B from the light irradiating device 140 for about 60 sec, the insulating layer 7 is obtained. In the second embodiment, the wavelength of the light irradiated to the insulating material layer 7B is 365 nm.

In this way, since the insulating material layer 7B as a base layer is hardened before forming the pattern (FIG. 6D) of the conductive material layer 8B to be described later, disconnection of the pattern of the conductive material layer 8B is not generated.

Figure 6D:
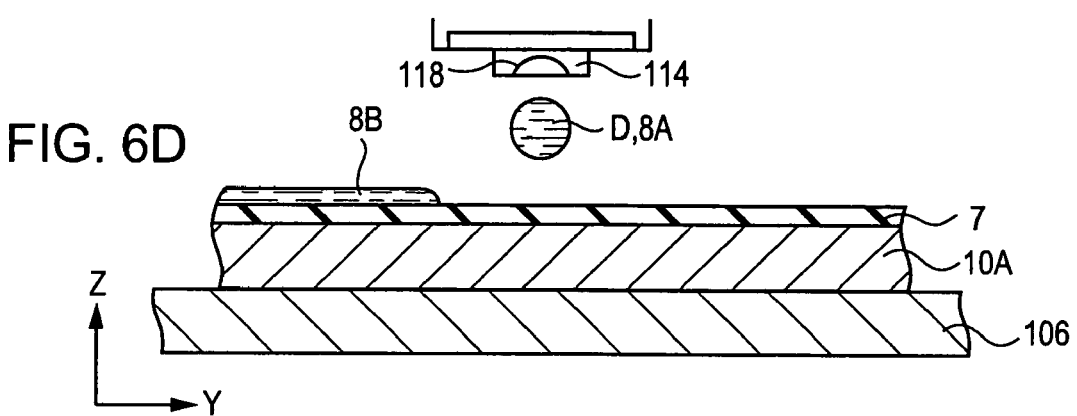

Next, as shown in FIG. 6D, the pattern of the conductive material layer 8B is formed on the insulating layer 7 by using the liquid droplet ejecting apparatus 2. Specifically, first, the substrate 10A is positioned on the stage 106 of the liquid droplet ejecting apparatus 2. Then, the liquid droplet ejecting apparatus 2 varies the relative position of the nozzles 118 to the surface of the insulating layer 7 two-dimensionally. Then, the liquid droplet ejecting apparatus 2 ejects the droplets D of the liquid conductive material 8A to the surface of the insulating layer 7 from the nozzles 118 in accordance with second ejection data, every time the nozzles 118 reach the position corresponding to the pattern of the conductive material layer 8B. Accordingly, a plurality of droplets D reaches the insulating layer 7 and is wet-diffused. When the reached droplets D are wet-diffused, the pattern of the conductive material layer 8B is formed on the insulating layer 7. The volume and number of the droplets D of the conductive material 8A to be ejected are set such that the thickness of the conductive layer 8 (FIG. 7B) obtained after the heating process to be described later is about 4 μm.

Here, the surface of the insulating layer 7 is an example of the "object surface" of the invention.

Figure 7A:
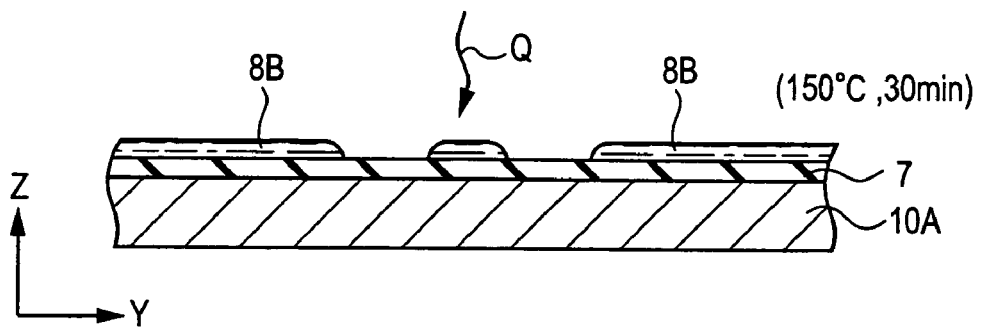
FIGS. 7A to 7C are cross-sectional views illustrating the method of manufacturing the wiring substrate according to the second embodiment.
Figure 7B:
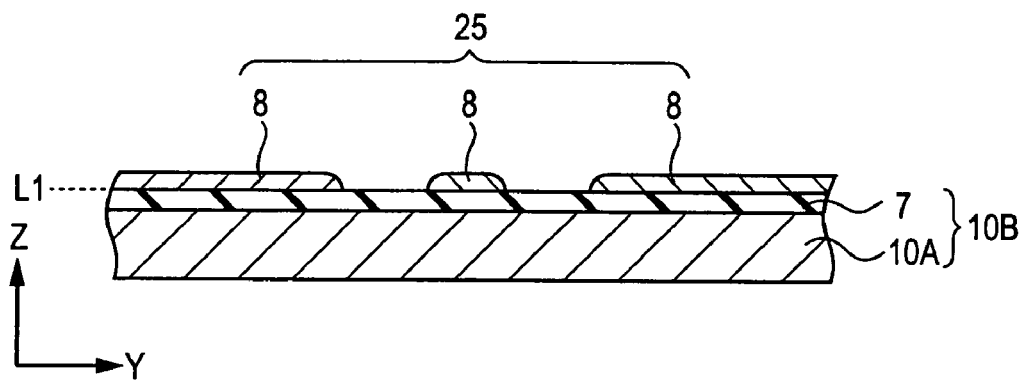

Next, as shown in FIG. 7A, by activating the pattern of the conductive material layer 8B, the pattern of the conductive layer 8 shown in FIG. 7B is formed. Specifically, the pattern of the conductive material layer 8B is baked (heated) at a temperature of 150° C. for 30 minutes by using a clean heater. Then, the silver particles in the conductive material layer 8B is sintered or fused, thereby obtaining the pattern of the conductive layer 8. In the second embodiment, the pattern of the conductive layer 8 is denoted by the "wire pattern 25 (or conductive pattern)." FIGS. 7A and 7B shows the YZ section of the base body 10B. The YZ section means a plane parallel to both of the Y axis direction and the Z axis direction.

In the second embodiment, before providing an insulating pattern 11 (described later) covering the insulating layer 7 and the wire pattern 25, the conductive layer 8 is formed by baking the conductive material layer 8B in advance. Then, the possibility that the conductive layer 8 should be deformed due to the stress resulting from the hardening contraction of the insulating pattern 11 is further reduced. This is because the adhesive force between the insulating layer 7 and the conductive layer 8 is greater than the adhesive force between the insulating layer 7 and the conductive material layer 8B (the conductive layer 8 not activated).

The wire pattern 25 is positioned on the insulating layer 7 made of acryl resin. Since the insulating layer 7 made of acryl resin serves to adhere the wire pattern 25 made of silver to the substrate 10A made of polyimide, the wire pattern 25 in the second embodiment is hardly peeled off.

Figure 7C:
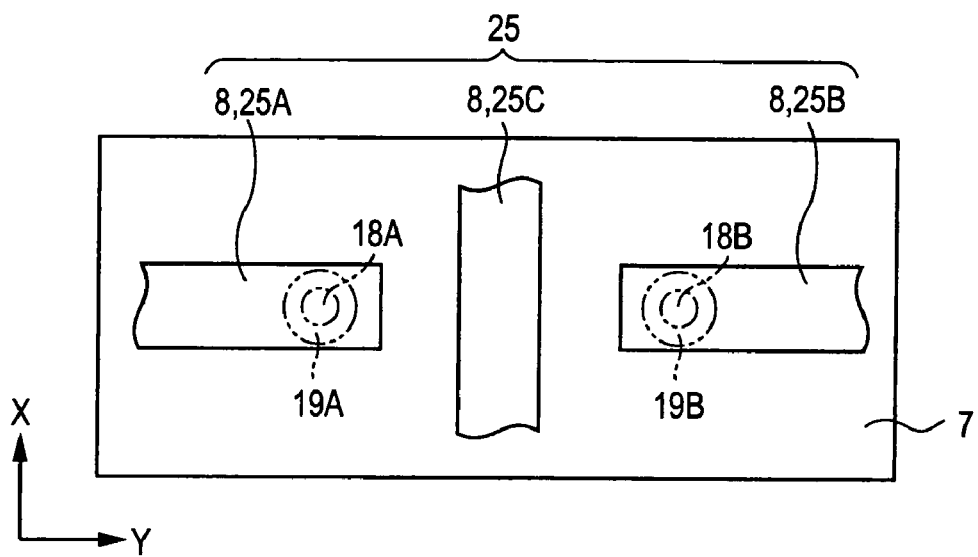

The wire pattern 25 includes a wire 25A, a wire 25B, and a wire 25C, as shown in FIG. 7C. The wires 25A, 25B, and 25C all have a stripe shape. The width of each wire 25A, 25B, and 25C is about 50 μm. More specifically, each wire 25A, 25B, and 25C is positioned on a part of the insulating layer 7 which is a so-called "solid film." That is, the wires 25A, 25B, and 25C are all positioned on the surface L1 at the equal level. However, any two wires of the wires 25A, 25B, and 25C are physically separated from each other on the surface L1. The wire 25A and the wire 25B should be electrically connected to each other by means of the subsequent process. On the other hand, the wire 25C should be electrically isolated from both of the wire 25A and the wire 25B. FIG. 7C shows the XY plane of the base body 10B. The XY plane means a plane parallel to both of the X axis direction and the Y axis direction.

In the second embodiment, a post forming area 18A is established on the wire 25A and a post forming area 18B is established on the wire 25B. The post forming areas 18A and 18B means the positions at which a conductive post should be formed later. A base area 19A is positioned to surround the post forming area 18A and a base area 19B is positioned to surround toe post forming area 18B.

Figure 8A:
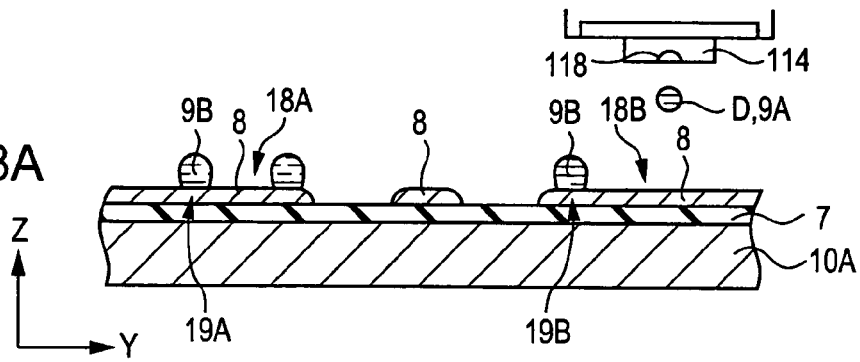
FIGS. 8A to 8D are cross-sectional views illustrating the method of manufacturing the wiring substrate according to the second embodiment.

Next, as shown in FIG. 8A, the insulating material pattern 9B is provided on the base areas 19A and 19B by using the liquid droplet ejecting apparatus 3.

Specifically, the substrate 10A is positioned on the stage 106 of the liquid droplet ejecting apparatus 3. Then, the liquid droplet ejecting apparatus 3 varies the relative position of the nozzles 118 to the surface of the base body 10B two-dimensionally. Then, the liquid droplet ejecting apparatus 3 ejects the droplets D of the liquid insulating material 9A to the surface of the base areas 19A and 19B from the nozzles 118 in accordance with third ejection data, every time the nozzles 118 reach the positions corresponding to the base areas 19A and 19B. Accordingly, a plurality of droplets D reaches the base areas 19A and 19B and is wet-diffused. When the reached droplets D are wet-diffused, the insulating material pattern 9B is formed on the base areas 19A and 19B.

Here, since the base areas 19A and 19B are the surface of the wire pattern 25 made silver, the base areas 19A and 19B exhibit the lyophobic property with respect to the insulating material 9A. As a result, the degree of wet-diffusion of the droplets D of the insulating material 9A reaching the base areas 19A and 19B is small. Accordingly, the base areas 19A and 19B are suitable for shaping a via hole using the inkjet method.

Figure 8B:
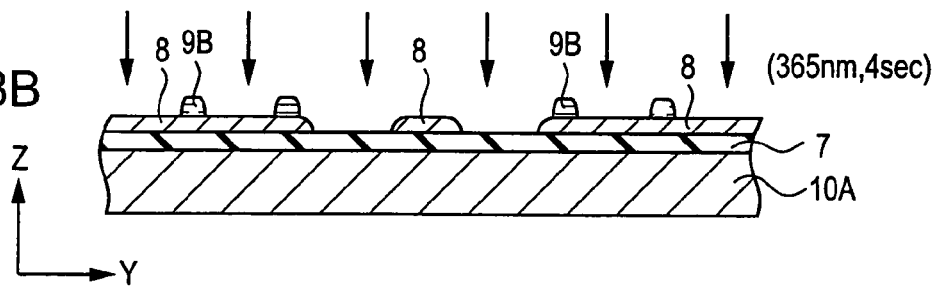
Figure 8C:
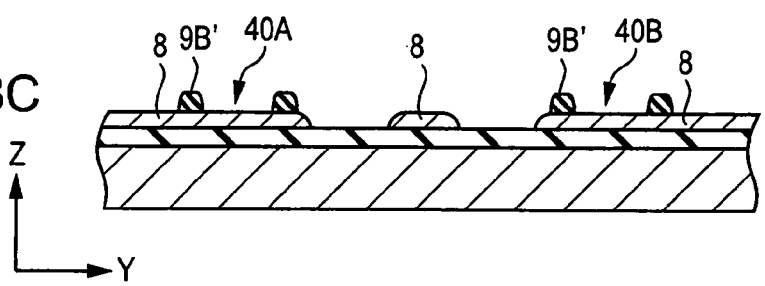

Next, as shown in FIGS. 8B and 8C, the obtained insulating material pattern 9B is semi-hardened to form an insulating material pattern 9B'. Concretely, the light irradiating device 140 irradiates light having an ultraviolet ray band to the insulating material pattern 9B for about 4 seconds to obtain the semi-hardened insulating material pattern 9B'. In the present embodiment, the wavelength of the light irradiated to the insulating material pattern 9B 365 nm. Also, the insides of two insulating material pattern 9B' become the via holes 40A and 40B. That is, the two insulating material patterns 9B' trims the via holes 40A and 40B, respectively. Further, the wavelength of the light irradiated to the insulating material pattern 9B corresponds to the "first wavelength" of the present invention.

Here, semi-hardening the "insulating material pattern" or the "insulating material" means that the state of the photo-curing material contained in the "insulating material pattern" or the "insulating material" becomes the state between the ejecting state and the substantially hardening state due to light irradiation. In the present embodiment, this middle state is the "semi-hardened state". Further, the ejecting state is the state that the photo-curing material has viscosity that the photo-curing material can be ejected from the nozzle 118.

Figure 8D:
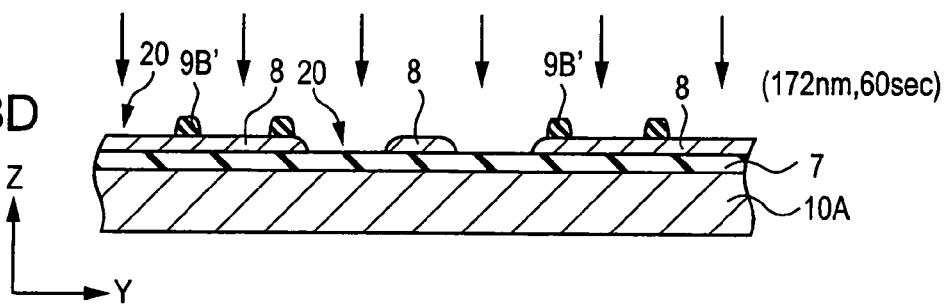

Next, as shown in FIG. 8D, the base area 20 has the lyophilic property. Here, the base area 20 contacts with the base areas 19A and 19B and surrounds the base areas 19A and 19B. The base area 20 is the surface which is different from the base areas 19A and 19B and the post-forming regions 18A and 18B. In the embodiment, the base area 20 is composed of a portion of the surface of the wire pattern 25 and a portion of the surface of the insulating layer 7.

When the base area 20 has the lyophilic property, light having a second wavelength different from the first wavelength is uniformly irradiated to the surface of the base area 20 for about 60 sec. Accordingly, the surface of the insulating layer 7 which is a portion of the base area 20 exhibits the lyophilic property to the below-mentioned liquid insulating material 11A (FIG. 9A). Further, in the present embodiment, the second wavelength is 172 nm.

Furthermore, one of the indices representing the degree of the lyophilic property is a "contact angle". In the present embodiment, when the liquid droplet D of the insulating material 11A contacts with the surface of the lyophilic insulating layer 7, the contact angle between the liquid droplet D and the surface of the insulating layer 7 is 20 degree or less.

The reason why the surface of the insulating layer 7 has the lyophilic property is as follows: If the curing process for obtaining the insulating layer 7 or the baking (heating) process for obtaining the wire pattern 25 is performed, the surface of the insulating layer 7 exhibits the lyophobic property. Here, when the surface of the object exhibits the lyophobic property, a uniform layer can not be formed over a wide area. On the contrary, since the surface of the insulating layer 7 exhibits the lyophilic property after the baking process in the embodiment, the degree (lyophilic degree) that the liquid droplet of the insulating material 11A is wet-diffused increases over the surface of the insulating layer again. Thus, the flat insulating pattern 11 can be formed over the insulating layer 7.

Next, the insulating material pattern 11B is formed on the underlying material pattern 11B using the liquid droplet ejecting apparatus 4. Concretely, as shown in FIG. 9A, first the substrate 10A is positioned on the stage 106 of the liquid droplet ejecting apparatus 4. Then, the liquid droplet ejecting apparatus 4 two-dimensionally changes the relative location of the nozzle to the base area 20. Further, the liquid droplet ejecting apparatus 4 ejects the liquid droplet D of the liquid insulating material 11A from the nozzle 118 to the surface of the wire pattern 25 or the surface of the insulating layer 7 according to the fourth ejecting data, whenever the nozzle 118 reaches a location corresponding to the insulating material pattern 111B. Thus, the droplets D reach the base area 20 and are wet-diffused. When the liquid droplets D are wet-diffused, the insulating material pattern 11B is formed on the insulating layer 7 and the wire pattern 25. That is, the insulating material pattern 11B surrounding the insulating material pattern 9B' is obtained.

As described above, a surface of an insulating layer 7 has a lyophilic property to the liquid insulating material 11A by the aforementioned lyophilic process. For the reason, the liquid droplets D of the insulating material 11A reaching the surface of the insulating layer 7 can be uniformly wet-diffused on the surface. In addition, the volume of the ejected liquid droplets D are set to the fourth ejection data, so that a step difference (a height of about 4 μm) between the insulating layer 7 and the wire pattern 25 located on the insulating layer 7 can be absorbed. As a result, the surface of the insulating pattern 11 obtained after a curing process described later can be planarized over the insulating pattern 11.

Next, as shown in FIGS. 9B and 9C, the insulating material pattern 11B' is formed by semi-hardening the insulating material pattern 11B. More specifically, by irradiating light having a UV wavelength on the insulating material pattern 11B for about 4 seconds with light irradiating device 140, the insulating material pattern 11B' in a semi-hardened state is obtained. In the embodiment, the wavelength of the light irradiated on the insulating material pattern 11B is 365 m. Here, the wavelength of the light irradiated on the insulating material pattern 11B corresponds to a "third wavelength" of the present invention. Like this, in the embodiment, in a case where the aforementioned "first wavelength" and the "third wavelength" are equal to each other. However, in a case where, the photo-curing material contained in the insulating material pattern 9B and the photo-curing material contained in insulating material pattern 11B are different from each other, the "first wavelength" and the "third wavelength" may be different from each other. In addition, the process for semi-hardening the insulating material pattern 11B may be omitted.

After the insulating material pattern 11B' in the semi-hardened state is obtained, as shown in FIG. 9C, by heating the gas 10B, the heat quantity Q' is applied. In the embodiment, by using a clean oven, the gas 10B is heated at a temperature of 1500 for about 60 minutes. Since the polymerization reaction of the resins in the insulating material patterns 9B' and 11B' further proceed due to the heating, the resins in the insulating material pattern are almost completely cured. As a result, the insulating material pattern 9B' and the insulating material pattern 11B' become the insulating pattern 9 and the insulating pattern 11, respectively.

As described above, since the base areas 19A and 19B are in contact with the base areas 20, the insulating pattern 11 is also in contact with the insulating pattern 9. In addition, a thickness of the insulating pattern 11 is about 10 μm on the insulating layer 7 and about 6 μm on the wire pattern 25. In addition, the ejecting scan of the liquid droplets D by the liquid droplet ejecting apparatus 4 is set, so that the surface of the insulating pattern 9 and the surface of the insulating pattern 11 can constitute the same level surface L3.

In the embodiment, the insulating material pattern 9B' and the insulating material pattern 11B' are heated at a time. Namely, two insulating material patterns are thermally polymerized at a time. For the reason, the resin constituting the insulating material pattern 9B' and the resin constituting the insulating material pattern 11B' are simultaneously contracted by the polymerization reaction, so that stress cannot be remained at the interface between the insulating pattern 9 and the insulating pattern 11. As a result, a multi-layered structure which is invulnerable to external impact and heat can be obtained on the substrate 10A.

After the insulating pattern 11 is formed, as shown in FIG. 9D, the via holes 40A and 40B trimmed with the insulating pattern 9 are filled with the conductive material 15A by using liquid droplet ejecting apparatus 5.

More specifically, firstly, the liquid droplet ejecting apparatus 5 two-dimensionally changes the relative positions of the nozzles 118 to the gas 10B. In addition, in a case where the nozzles 118 reaches the positions corresponding to the via holes 40A and 40B, the liquid droplet ejecting apparatus 5 ejects the liquid droplets D of the conductive material 15A through the nozzles 118. The ejected liquid droplets D of the conductive material 15A reach the pattern (wire pattern 25) of the exposed conductive layer 8 through the via holes 40A and 40B. Next, the number of the liquid droplets D enough to fill the via holes 40A and 40B reach inner portions of the via holes 40A and 40B, so that the via holes 40A and 40B filled with the conductive material 15A as shown in FIG. 9D.

Next, by using the liquid droplet ejecting apparatus 5 again, the liquid droplets D of the conductive material 15A are ejected to form the conductive material pattern 15B for connecting the two via holes 40A and 40B on the insulating patterns 9 and 11.

Figure 10A:
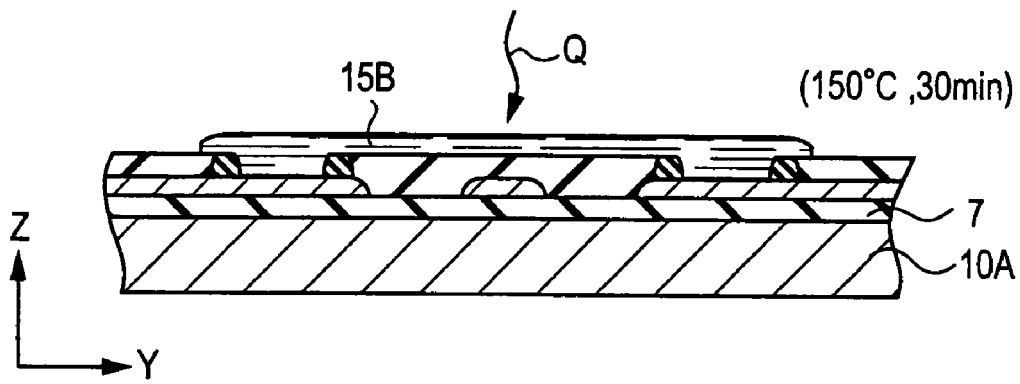
FIGS. 10A to 10C are cross-sectional views illustrating the method of manufacturing the wiring substrate according to the second embodiment.
Figure 10B:
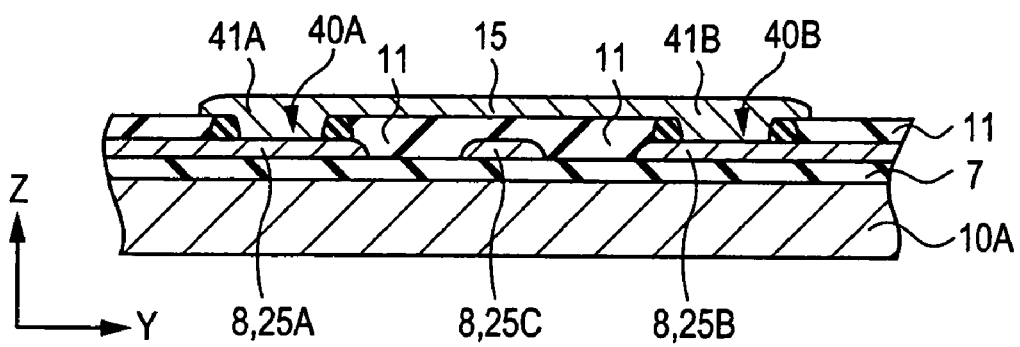

In addition, the conductive material 15A and the conductive material pattern 15B in the via holes 40A and 40B are activated. In the embodiment, as shown in FIG. 10A, by heating with the applied heat quantity Q, fine particles of silver in the conductive material 15A are sintered or fused. More specifically, by using a clean oven, the gas 10B is heated at a temperature of 150° for 30 minutes. As the result of the activation, as shown in FIG. 10B, the wire patterns 15 connected to the conductive posts 41A and 41B and the conductive posts 41A and 41B within the respective via holes 40A and 40B are obtained.

Through the conductive posts 41A and 41B and the wire pattern 15, the wires 25A and 25C which are a portion of the wire pattern 25 are electrically connected to each other. On the other hand, the wires 25B which is a portion of the wire pattern 25 is electrically insulated from the wire 25A as well as the wire 25C.

Next, although not shown, the lyophilic property is given to the surfaces of the insulating patterns 9 and 11 and the surface of the wire pattern 15. More specifically, the light having the aforementioned second wavelength is uniformly irradiated on the gas 10B for about 60 minutes. By doing so, the surfaces of the insulating patterns 9 and 11 and the surface of the wire pattern 15 can have the lyophilic property to the liquid insulating material 17A (FIG. 1). As described above, the second wavelength is 172 nm.

After that, by using the ejecting process (not shown) of the liquid insulating material 17A with the liquid droplet ejecting apparatus 6, the insulating material layer 17B covering the insulating pattern 9 and 11 the wire pattern 15 is formed.

In addition, by curing the insulating material layer 17B, the insulating layer 17 is formed. More specifically, the light irradiating device 140 irradiates the light having the first wavelength in UV range on the insulating material layer 17B for about 60 minutes to for the insulating layer 17. In the embodiment, the first wavelength is 365 nm. The insulating layer 17 is a film.

Figure 10C:
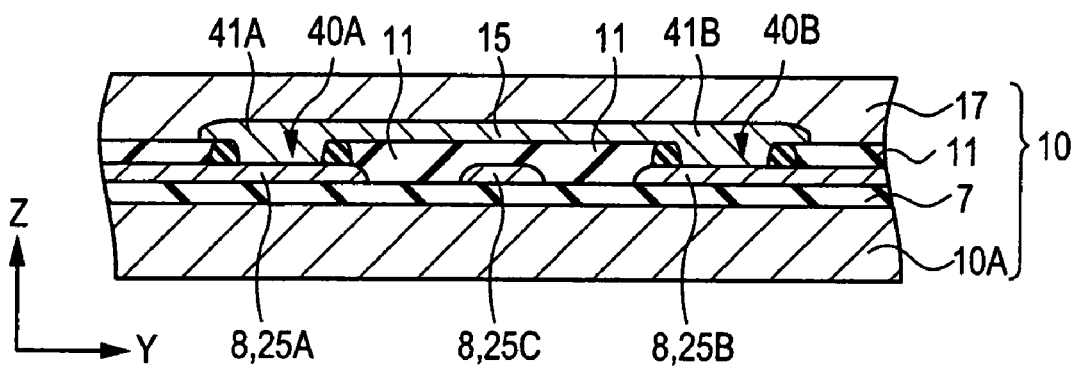

Thereafter, by using a clean oven, the gas 10B is heated, so that the polymerization reaction of the polymer in the insulating layer 17 completely proceeds. By performing the aforementioned processes, the wire substrate 10 shown in FIG. 10C is obtained from the gas 10B.

G. Mounting Process

Figure 11:
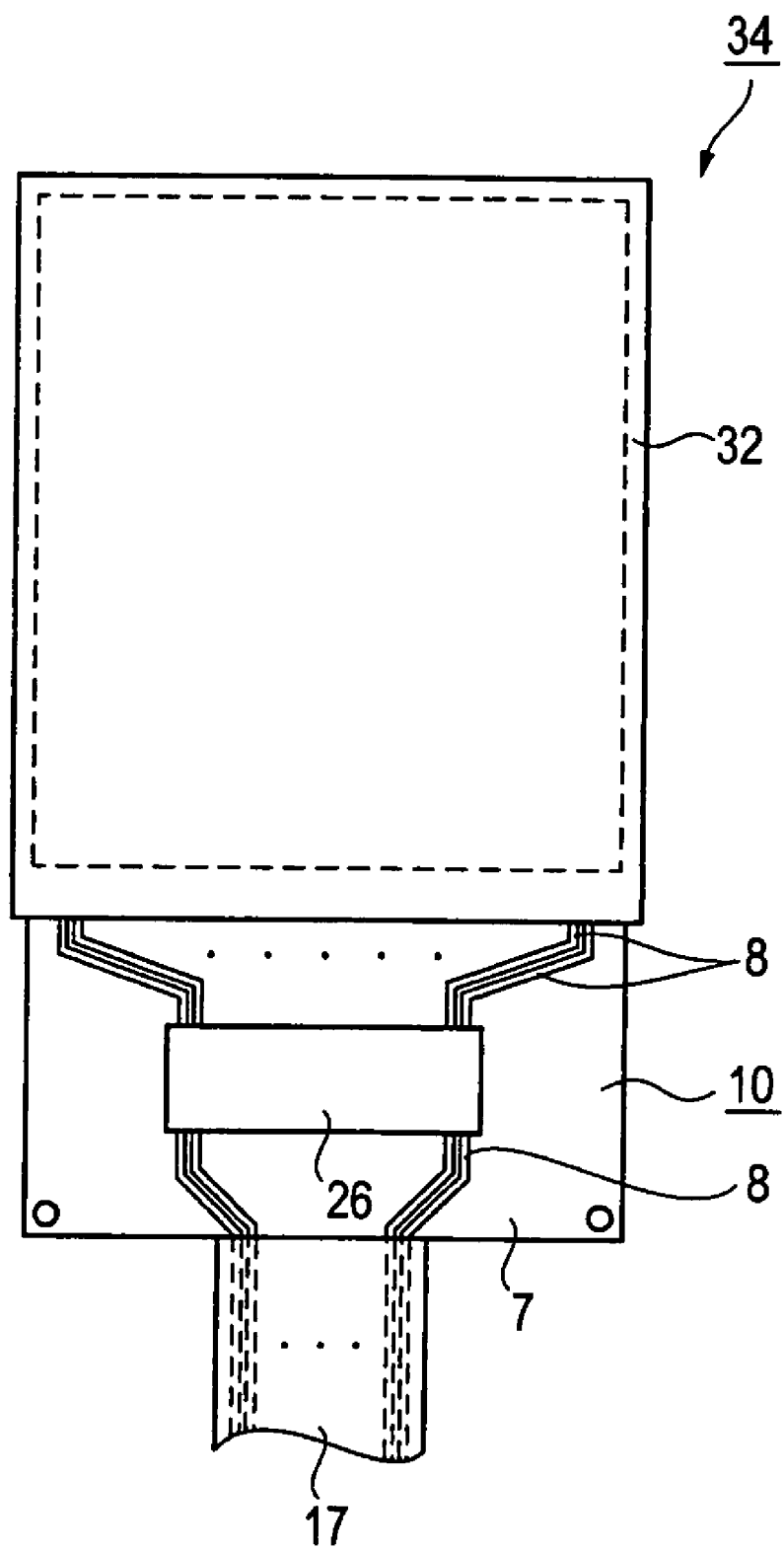
FIG. 11 is a schematic view of a liquid crystal display device according to the first, second, and third embodiments.

Next, as shown in FIG. 11, the liquid crystal panel 32 and the semiconductor device 26 are mounted on the wire substrate 10. More specifically, on a portions of the wire substrate 10, there is formed a portion where the patterns of the conductive layer 8 are not formed in the insulating patterns 9 and 11 and the insulating layer 17. In addition, the pads corresponding to the liquid crystal panel or the pads corresponding to the semiconductor device 26 are properly attached to the patterns of the exposed conductive layer 8. Like this, a method according to the embodiment can be applied to manufacture the liquid crystal display device 34. In addition, in the embodiment, the semiconductor device 26 is a liquid crystal driver circuit.

In addition, the method according to the embodiment can be applied to manufacture various electro-optical devices as well as the liquid crystal display device. Here, the aforementioned "electro-optical device" is not limited to devices utilizing change in optical properties (so-called electro-optical effect) such as change in birefringence, changes in optical rotary power, and change in optical scattering power. But the electro-optical device means all the apparatuses for projecting, emitting, transmitting, or reflecting light according to applied signal voltages.

More specifically, the electro-optical device is a term including a liquid crystal display device, electroluminescence display device, a plasma display device, a surface-conduction electron-emitter (SED) display, and a field emission display (FED).

Figure 12:
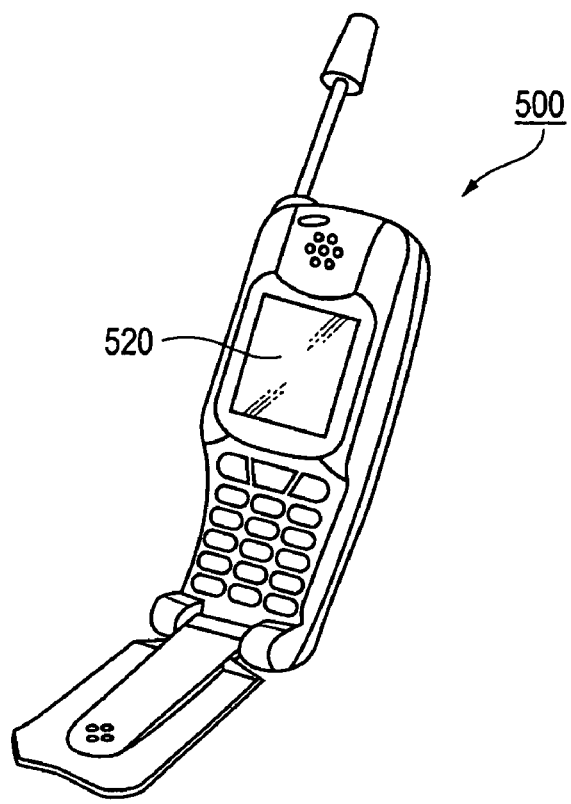
FIG. 12 is a schematic view illustrating a cellular phone according to the first, second, and third embodiments.
Figure 13:
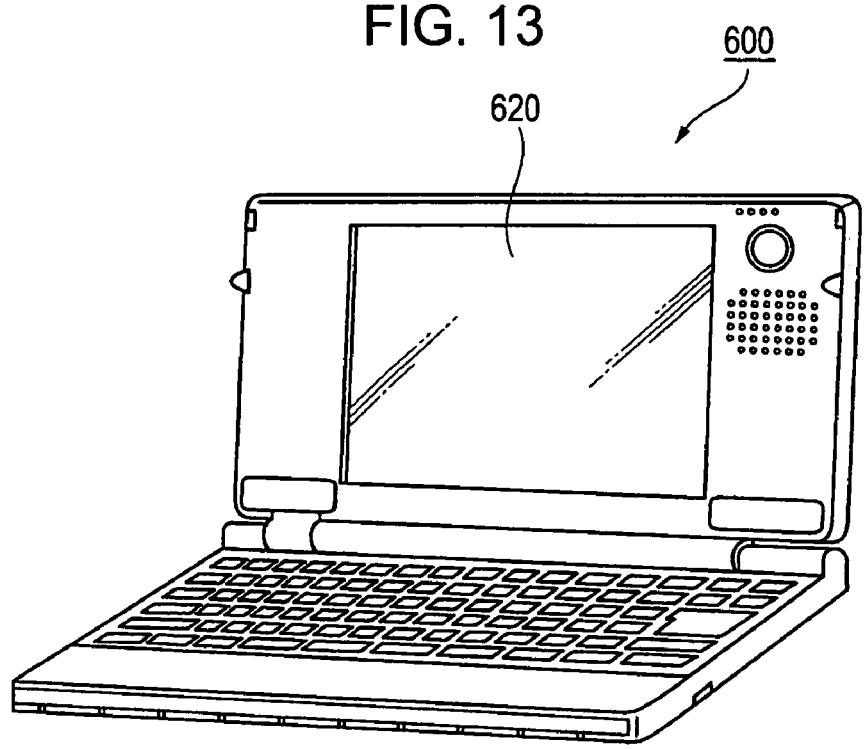
FIG. 13 is a schematic view illustrating a personal computer according to the first, second, and third embodiments.

In addition, a multi-layered structure forming method according to the embodiment can be applied to methods of manufacturing various electronic apparatuses. For example, the method according to the embodiment can be applied for a method of manufacturing a mobile phone 500 including an electro-optical device 520, as shown in FIG. 12, and a method of manufacturing a personal computer 600 including an electro-optical device 620, as shown in FIG. 13.

In addition, instead of the wire substrate 10 according to the embodiment, the wire substrate 10 used for the aforementioned electro-optical devices or electronic apparatuses may be a wire substrate 10 according to the first embodiment or a wire substrate 10 according to a third embodiment described later.

Third Embodiment

The multi-layered structure forming method according to the present embodiment is basically identical to the multi-layered structure forming method according to the second embodiment except for the method of forming the insulating pattern 1. Accordingly, the same process and construction as the second embodiment will be omitted so as to avoid overlapping.

First, as mentioned in the second embodiment, a semi-hardened insulating material pattern 9B' is formed on base areas 19A and 19B on a wire pattern 25 (FIGS. 8A through 8C). Thereafter, light is irradiated to an base area 20 and the surface of an insulating layer 7 has the lyophilic property (FIG. 8D). The following processes are performed so that the flat surface is always subjected to the ejecting process for forming the insulating pattern.

Figure 14A:
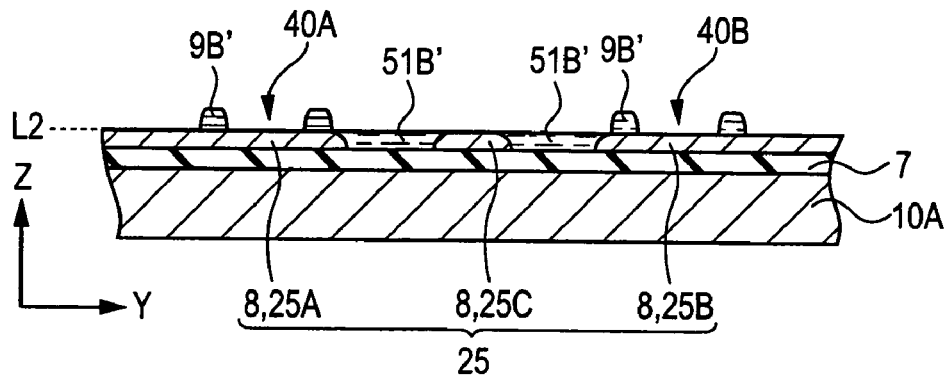
FIGS. 14A to 14C are cross-sectional views illustrating a method of manufacturing a wiring substrate according to the third embodiment.

As shown in FIG. 14A, by means of the ejecting process and the semi-hardening process, a semi-hardened insulating material pattern 51B' is formed on a portion which does not have the wire pattern 25 as a portion of the insulating layer 7. Since the thickness of the insulating material pattern 51B' is equal to that of the wire pattern 25, the step generated by the wire pattern 25 is removed. That is, the wire pattern 25 and the insulating material pattern 51B' form a surface L2 having substantially the same level.

Figure 14B:
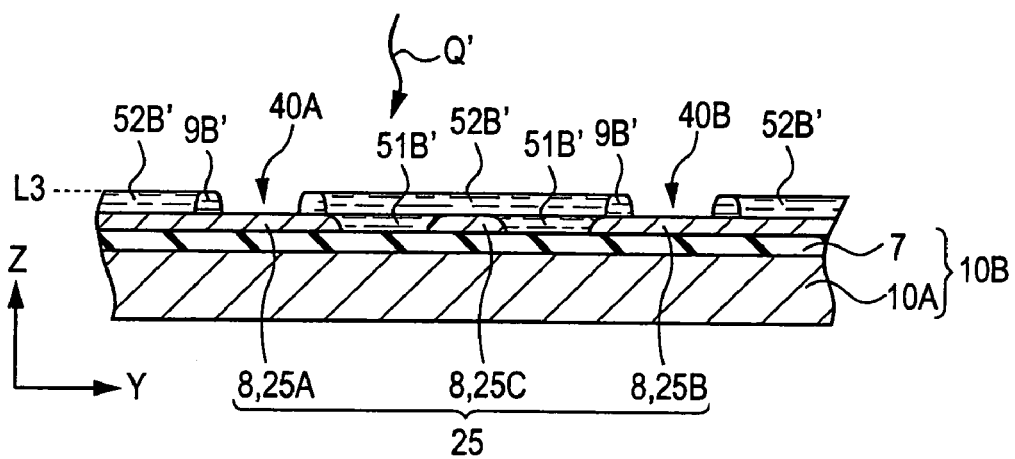

Further, by means of the ejecting process and the semi-hardening process, a semi-hardened insulating material pattern 52B' is formed on a portion which does not have an insulating material pattern 9B' and via holes 40A and 40B in the surface L2. Thereby, as shown in FIG. 14B, an insulating material pattern 52B' surrounding the insulating material pattern 9B' is obtained. Here, the underlying insulating material pattern 51B' is semi-hardened and thus the surface of the insulating material pattern 51B' exhibits the lyophilic property to the liquid droplet D for forming the insulating material pattern 52B'. Since the lyophilic property is given to the surface of the insulating material pattern 51B', the insulating material pattern 52B' having a uniform thickness is easily formed on the insulating material pattern 51B'.

Since the thickness of the insulating material pattern 52B' is equal to that of the insulating material 9B', the insulating material pattern 52B' and the insulating material pattern 9B' form a surface L3 having a substantially same level.

Figure 14C:
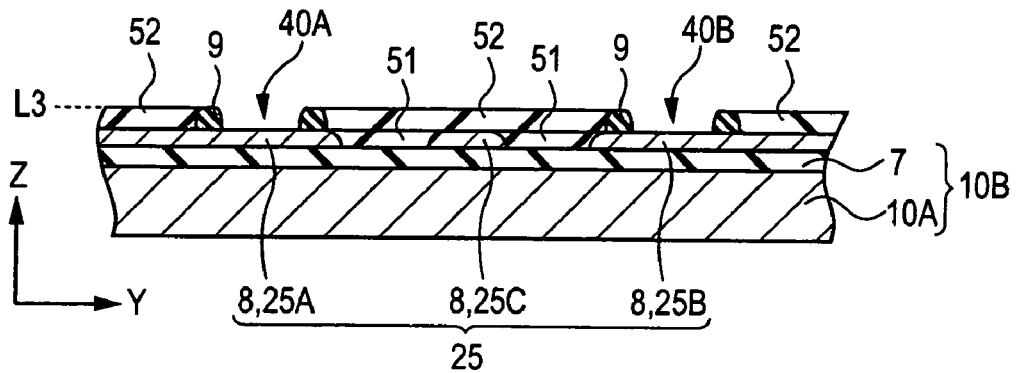

Furthermore, as shown in FIG. 14B, gas 10B is heated to apply a heat value Q'. In the present embodiment, the gas 10B is heated using a clean oven at a temperature of 150 degree for about 60 minutes. Since the polymerization reaction of the resin is more progressed in the insulating material patterns 9B', 51B', and 52B' by this heating, the resin of each pattern is completely hardened. As this result, as shown in FIG. 14C, the insulating material pattern 9B', the insulating material pattern 51B', and the insulating material pattern 52B' become the insulating pattern 9, the insulating pattern 51, and the insulating pattern 52, respectively.

Thereafter, a wiring substrate 10 can be formed by performing the processes similar to the second embodiment.

The insulating pattern 51 and the insulating pattern 52 of the present embodiment correspond to the insulating pattern 11 of the second embodiment. In the present embodiment, a portion corresponding to the insulating pattern 11 of the second embodiment is formed by several "ejection formation" processes. The "ejection formation" means the formation of the material pattern using the ejecting process, and, in a narrow sense, means a set of the formation of the material pattern using the ejecting process and the semi-hardening of the material pattern using the semi-hardening process.

When these processes are performed, the insulating pattern is always formed on the flat surface. Thus, even in the case that the thickness of the wire pattern 25 is large, the side of the wire pattern 25 can be preferably covered by the insulating pattern.

First Modified Example

According to the first, second, and third embodiments, the six liquid droplet ejecting apparatuses 1, 2, 3, 4, 5, and 6 eject the insulating material 7A, the conductive material 8A, the insulating material 9A, the insulating material 11A, the conductive material 15A, and the insulating material 17A, respectively. Instead of this construction, one liquid droplet ejecting apparatus (for example, the liquid droplet ejecting apparatus 1) may eject at least two different "liquid materials". In this case, at least two "liquid materials" may be ejected from the nozzles of the liquid droplet ejecting apparatus 1, respectively, or may be ejected from one nozzle of the liquid droplet ejecting apparatus 1. In the case that the at least two different "liquid materials" are ejected from one nozzle 118, a process of cleaning a path from the tank 101 to the nozzle 118 may be added when switching the "liquid material".

Here, in the case that the at least two different "liquid materials" are ejected from one nozzle 118, the "first nozzle", the "second nozzle", and the "third nozzle" described in the first embodiment correspond to one nozzle 118.

Second Modified Example

According to the first, second, and third embodiments, the multi-layered structure is formed on the substrate 10A made of polyimide. However, instead of the substrate 10A, a ceramic substrate, a glass substrate, an epoxy substrate, a glass epoxy substrate, or a silicon substrate may be used, and, even in these cases, the same effect as the aforementioned embodiments can be obtained.

Third Modified Example

The conductive materials 8A and 15A of the first, second, and third embodiments contain the nano-particles of silver. However, instead of the nano-silver of the silver, the nano-particles of the other metal may be used. Here, as the other metal, for example, any one of gold, platinum, copper, palladium, rhodium, osmium, ruthenium, iridium, iron, tin, zinc, cobalt, nickel, chrome, titanium, tantalum, tungsten, and indium may be used, or a combination of at least two thereof may be used. However, since the silver can be reduced at a relatively low temperature, the treatment is easy. Accordingly, in the case that the liquid droplet ejecting apparatus is used, it is preferable that the conductive materials 8A and 15A containing the nano-particles of the silver are used.

Moreover, the conductive materials 8A and 15A may contain an organic metal compound, instead of the nano-particles of the metal. Here, the organic metal compound is a compound from which metal is extracted by decomposition due to the heating. As the organic metal compound, there is chlorotriethylphosphine gold (I), chlorotrimethylphosphine gold (I), chlorotriphenlyphosphine gold (I), 2,4-pentanedionato complex, trimethylphosphine (hexafluoroacetylacetonato) silver (I) complex, or copper (I) hexafluoropentanedionatocyclooctadiene complex.

The shape of the metal contained in the liquid conductive materials 8A and 15A may be particles such as nano-particles or the compound such as the organic metal compound.

Furthermore, the conductive materials 8A and 15A may contain a high molecular soluble material such as polyaniline, polythiophene, or polyphenylenevinylidene.

Fourth Modified Example

In the first, second, and third embodiments, as mentioned above, the nano-particles of the silver of the conductive materials 8A and 15A may be coated with a coating agent such as an organic material. As the coating agent, there is amine, alcohol, or thiol. Concretely, as the coating agent, there is amine compound such as 2-methylaminoethanol, diethanolamine, diethylmethylamine, 2-dimethylaminoethanol, methyldiethanolamine, alkylamine, ethylenediamine, alkylalcohol, ethyleneglycol, propyleneglycol, or alkylthiol, ethanedithiol. The nano-particles of the silver covered by the coating agent may be more stably dispersed in a dispersion medium.

Fifth Modified Example

According to the first, second, and third embodiments, the "first photo-curing material" and the "second photo-curing material" are equal to each other. However, the present invention is not limited to this. That is, the "first photo-curing material" and "the second photo-curing material" may be different from each other. For example, according to the second and third embodiments, the insulating layer 7 and the insulating patterns 9, 11, 51, and 52 are made of the same material. Instead of this construction, the insulating layer 7 and the insulating patterns 9, 11, 51, and 52 are made of different materials. Concretely, the insulating layer 7 may be acrylic resin and the insulating patterns 9 and 11 may be polyimide resin. In this case, the insulating material 7A is a liquid material containing photosensitive acrylic resin or monomer/oligomer thereof, and the insulating materials 9A and 11A are liquid materials containing photosensitive polyimide precursor. Similarly, the relationship between the insulating layer 7 and the insulating layer 9 of the first embodiment may be changed. In the present invention, the "first photo-curing material" and the "second photo-curing material" may be different from each other.

Sixth Modified Example

According to the first embodiment, the pattern of the conductive layer 8 is formed on the insulating layer 7. However, the multi-layered structure forming method of the present invention is not limited to this. Concretely, the pattern of the conductive layer 8 formed on the insulating layer may be omitted. Further, the processes of forming the insulating material layers using the liquid droplet ejecting apparatus and semi-hardening the insulating material layers may be repeated so that the total thickness of a plurality of the insulating layers becomes a desired value. Even in this case, if the insulating material layers are hardened by one heating process, the stable wiring substrate is obtained in the external impact or heat.

Seventh Modified Example

According to the second and third embodiments, light having an ultraviolet ray band wavelength is irradiated so that the surface of the insulating layer 7 and the surfaces of the insulating patterns 9 and 11 has the lyophilic property. However, instead of giving the lyophilic property, an $O_2$ plasma process using oxygen as a processing gas in atmospheric ambient may be performed so that the surface of the insulating layer 7 and the surfaces of the insulating patterns 9 and 11 cannot have the lyophilic property. The $O_2$ plasma process is a process of irradiating plasma-state oxygen from a plasma discharge electrode (not shown). In the condition of the $O_2$ plasma process, a plasma power is 50-1000 W, an oxygen flow rate is 50-100 mL/min, a relative movement velocity of gas B to the plasma discharge electrode is 0.5-10 mm/sec, and a gas temperature is 70-90° C.

Eighth Modified Example

According to the first, second, and third embodiments, the insulating layer 7 is formed using the inkjet method. Concretely, the liquid material layer 7B is formed by the liquid droplet ejecting apparatus 1. However, the insulating layer 7 may be formed using the other layer forming method, instead of the inkjet method. For example, the insulating layer 7 may be formed using a printing method such as a screen printing method or a gravure printing method.

Ninth Modified Example

According to the first embodiment, the insulating layer 7 and the insulating layer 9L are formed using the inkjet method. Concretely, the insulating material layer 7B and the insulating material layer 9LB are formed by the liquid droplet ejecting apparatuses 1 and 3, respectively. However, the insulating layer 7 and the insulating layer 9L may be the other layer forming method, instead of the inkjet method. For example, the insulating layer 7 and the insulating layer 9L may be formed using a printing method such as a screen printing method or a gravure printing method.

Tenth Modified Example

In the second and third embodiments, the wire pattern 25 may be formed on the substrate 10A. Also, the wire pattern 25 may be a wire pattern of gold (Au). Even in the case that the wire pattern 25 is formed on the substrate 10A or is made of gold (Au) instead of silver (Ag), if the multi-layered structure forming method of the aforementioned embodiments is performed, the same effect as the aforementioned embodiments is obtained.

What is claimed is:

1. A multi-layered structure forming method comprising:
   (A) forming a first insulating material layer containing a first photo-curing material on a substrate;
   (B) semi-hardening the first insulating material layer by radiating light having a first wavelength to the first insulating material layer;
   (C) forming a conductive material layer on the semi-hardened first insulating material layer by ejecting droplets of a conductive material to the semi-hardened first insulating material layer from a nozzle of a liquid droplet ejecting apparatus;
   (D) forming a second insulating material layer containing a second photo-curing material so as to cover the semi-hardened first insulating material layer and the conductive material layer; and
   (E) forming a first insulating layer, a conductive layer positioned on the first insulating material, and a second insulating layer covering the first insulating layer and the conductive layer by simultaneously heating the first insulating material layer, the conductive material layer, and the second insulating material layer.

2. The multi-layered structure forming method according to claim 1, further comprising (F) semi-hardening the second insulating material layer by radiating light having a second wavelength to the second insulating material layer, between (D) and (E).

3. A method of manufacturing a wiring substrate, the method comprising the multi-layered structure forming method according to claim 1.

4. A method of manufacturing an electronic apparatus, the method comprising the method of manufacturing a wiring substrate according to claim 3.

* * * * *